US012439684B2

(12) United States Patent
Hwang et al.

(10) Patent No.: US 12,439,684 B2
(45) Date of Patent: Oct. 7, 2025

(54) THREE-DIMENSIONAL SEMICONDUCTOR DEVICE AND METHOD OF FABRICATING THE SAME

(71) Applicant: SAMSUNG ELECTRONICS CO., LTD., Suwon-si (KR)

(72) Inventors: Donghoon Hwang, Suwon-si (KR); Myungil Kang, Suwon-si (KR); Minchan Gwak, Suwon-si (KR); Kyungho Kim, Suwon-si (KR); Kyung Hee Cho, Suwon-si (KR); Doyoung Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 382 days.

(21) Appl. No.: 18/196,741

(22) Filed: May 12, 2023

(65) Prior Publication Data
US 2024/0105724 A1    Mar. 28, 2024

(30) Foreign Application Priority Data
Sep. 28, 2022 (KR) .................. 10-2022-0123341

(51) Int. Cl.
*H10D 84/85* (2025.01)
*H10D 30/01* (2025.01)
(Continued)

(52) U.S. Cl.
CPC ......... *H10D 84/856* (2025.01); *H10D 30/014* (2025.01); *H10D 30/43* (2025.01);
(Continued)

(58) Field of Classification Search
CPC .... H10D 84/856; H10D 30/014; H10D 30/43; H10D 30/6729; H10D 30/6735;
(Continued)

(56) References Cited

U.S. PATENT DOCUMENTS 10,192,867 B1    1/2019  Frougier et al.
10,236,292 B1 *  3/2019  Frougier .............. H10D 64/017
(Continued)

FOREIGN PATENT DOCUMENTS

DE    10 2020 105 936 A1    10/2020

OTHER PUBLICATIONS

Spessot et al., "Device Scaling roadmap and its implications for Logic and Analog platform", 2020 IEEE BiCMOS and Compound Semiconductor Integrated Circuits and Technology Symposium (BCICTS), 2020, pp. 1-8, doi:10.1109/BCICTS48439.2020.9392980.

*Primary Examiner* — Moazzam Hossain
(74) *Attorney, Agent, or Firm* — Sughrue Mion, PLLC

(57) ABSTRACT

A three-dimensional semiconductor device includes a first active region on a substrate, the first active region including a lower channel pattern and a lower source/drain pattern connected to the lower channel pattern, a second active region stacked on the first active region, the second active region including an upper channel pattern and an upper source/drain pattern connected to the upper channel pattern, a gate electrode on the lower channel pattern and the upper channel pattern, a lower contact electrically connected to the lower source/drain pattern, the lower contact having a bar shape extending on the lower source/drain pattern in a first direction, a first active contact coupled to the lower contact, and a second active contact coupled to the upper source/drain pattern. A first width of the lower source/drain pattern in a second direction is larger than a second width of the lower contact in the second direction.

20 Claims, 38 Drawing Sheets

(51) Int. Cl.
*H10D 30/43* (2025.01)
*H10D 30/67* (2025.01)
*H10D 62/10* (2025.01)
*H10D 64/01* (2025.01)
*H10D 84/01* (2025.01)
*H10D 84/03* (2025.01)
*H10D 88/00* (2025.01)

(52) U.S. Cl.
CPC ..... *H10D 30/6729* (2025.01); *H10D 30/6735* (2025.01); *H10D 62/121* (2025.01); *H10D 64/017* (2025.01); *H10D 84/0167* (2025.01); *H10D 84/017* (2025.01); *H10D 84/0186* (2025.01); *H10D 84/038* (2025.01); *H10D 88/01* (2025.01)

(58) Field of Classification Search
CPC ............... H10D 62/121; H10D 64/017; H10D 84/0167; H10D 84/017; H10D 84/0186; H10D 84/038; H10D 88/01; H10D 30/6757; H10D 84/85; H10D 84/0177; H10D 88/00; H10D 84/853; H10D 30/62; H10D 30/6713
See application file for complete search history.

(56) References Cited

U.S. PATENT DOCUMENTS

| | | | |
|---|---|---|---|
| 10,388,519 | B2 | 8/2019 | Smith et al. |
| 10,685,887 | B2 | 6/2020 | Smith et al. |
| 10,879,352 | B2 | 12/2020 | Zhang et al. |
| 10,937,903 | B2 | 3/2021 | Balakrishnan et al. |
| 11,145,668 | B2 | 10/2021 | Reznicek et al. |
| 11,239,236 | B2 | 2/2022 | Lilak et al. |
| 11,315,923 | B2 | 4/2022 | Reznicek et al. |
| 2021/0202499 | A1* | 7/2021 | Gardner ............. H10D 84/0167 |
| 2021/0349691 | A1 | 11/2021 | Hekmatshoartabari et al. |
| 2022/0123023 | A1* | 4/2022 | Peng ..................... H10D 86/441 |
| 2022/0216340 | A1* | 7/2022 | Lin ....................... H10D 84/013 |
| 2023/0253406 | A1* | 8/2023 | Wu ......................... H01L 21/743 257/369 |
| 2024/0105724 | A1* | 3/2024 | Hwang ................. H10D 84/85 |

* cited by examiner

THREE-DIMENSIONAL SEMICONDUCTOR DEVICE AND METHOD OF FABRICATING THE SAME

CROSS-REFERENCE TO RELATED APPLICATION

This application claims priority to Korean Patent Application No. 10-2022-0123341, filed on Sep. 28, 2022, in the Korean Intellectual Property Office, the disclosure of which is incorporated by reference herein in its entirety.

BACKGROUND

The present disclosure relates to a three-dimensional semiconductor device and a method of fabricating the same, and in particular, to a three-dimensional semiconductor device including a field effect transistor and a method of fabricating the same.

A semiconductor device may include an integrated circuit composed of metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may negatively affect operational properties of the semiconductor device. A variety of studies are being conducted to overcome technical limitations associated with the scale-down of the semiconductor device and to realize the semiconductor devices with high performance.

SUMMARY

One or more example embodiments provide a three-dimensional semiconductor device with an increased integration density and improved electrical characteristics.

One or more example embodiments provide a method of fabricating a three-dimensional semiconductor device with an increased integration density and improved electrical characteristics.

According to an aspect of an example embodiment, a three-dimensional semiconductor device includes: a first active region on a substrate, the first active region including a lower channel pattern and a lower source/drain pattern connected to the lower channel pattern; a second active region on the first active region, the second active region including an upper channel pattern and an upper source/drain pattern connected to the upper channel pattern; a gate electrode on the lower channel pattern and the upper channel pattern; a lower contact electrically connected to the lower source/drain pattern, the lower contact having a bar shape extending on the lower source/drain pattern in a first direction; a first active contact coupled to the lower contact; and a second active contact coupled to the upper source/drain pattern. A first width of the lower source/drain pattern in a second direction is larger than a second width of the lower contact in the second direction.

According to another aspect of an example embodiment, a three-dimensional semiconductor device includes: a first active region on a substrate, the first active region including a pair of lower channel patterns and a lower source/drain pattern between the pair of lower channel patterns; a second active region on the first active region, the second active region including a pair of upper channel patterns and an upper source/drain pattern between the pair of upper channel patterns; gate electrodes provided on the pair of lower channel patterns and the pair of upper channel patterns; a lower contact electrically connected to the lower source/drain pattern; a first active contact coupled to the lower contact; and a second active contact coupled to the upper source/drain pattern. The upper source/drain pattern includes a first sub-pattern connected to one of the pair of upper channel patterns, and a second sub-pattern connected to another one of the pair of upper channel patterns, the first sub-pattern is separated from the second sub-pattern, and the second active contact includes a first contact and a second contact, which are respectively coupled to the first sub-pattern and the second sub-pattern.

According to an aspect of an example embodiment, a three-dimensional semiconductor device includes: a first active region on a first region of a substrate, the first active region including a first lower channel pattern and a first lower source/drain pattern connected to the first lower channel pattern; a second active region on the first active region, the second active region including first upper channel pattern and a first upper source/drain pattern connected to the first upper channel pattern; a gate electrode on the first lower channel pattern and the first upper channel pattern; a first peripheral active region on a second region of the substrate, the first peripheral active region including a second lower channel pattern and a second lower source/drain pattern connected to the second lower channel pattern; a second peripheral active region on the first peripheral active region, the second peripheral active region including a second upper channel pattern and a second upper source/drain pattern connected to the second upper channel pattern; a peripheral gate electrode on the second lower channel pattern and the second upper channel pattern; a first active contact coupled to the first upper source/drain pattern; and a second active contact coupled to the second upper source/drain pattern. The first upper channel pattern includes a pair of first upper channel patterns, which are adjacent to each other, the first upper source/drain pattern is provided as a continuous body connecting the pair of first upper channel patterns to each other, the second upper channel pattern includes a pair of second upper channel patterns, which are adjacent to each other, the second upper source/drain pattern includes a first sub-pattern connected to one of the pair of second upper channel patterns, and a second sub-pattern connected to another one of the pair of second upper channel patterns, and the first sub-pattern is separated from the second sub-pattern.

BRIEF DESCRIPTION OF DRAWINGS

The above and other aspects and features will be more apparent from the following description of example embodiments taken in conjunction with the accompanying drawings, in which.

DETAILED DESCRIPTION

Example embodiments will be described with reference to the accompanying drawings, in which example embodiments are shown. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be also understood that, even if a certain step or operation of manufacturing an apparatus or structure is described later than another step or operation, the step or operation may be performed later than the other step or operation unless the other step or operation is described as being performed after the step or operation.

Figure 1:
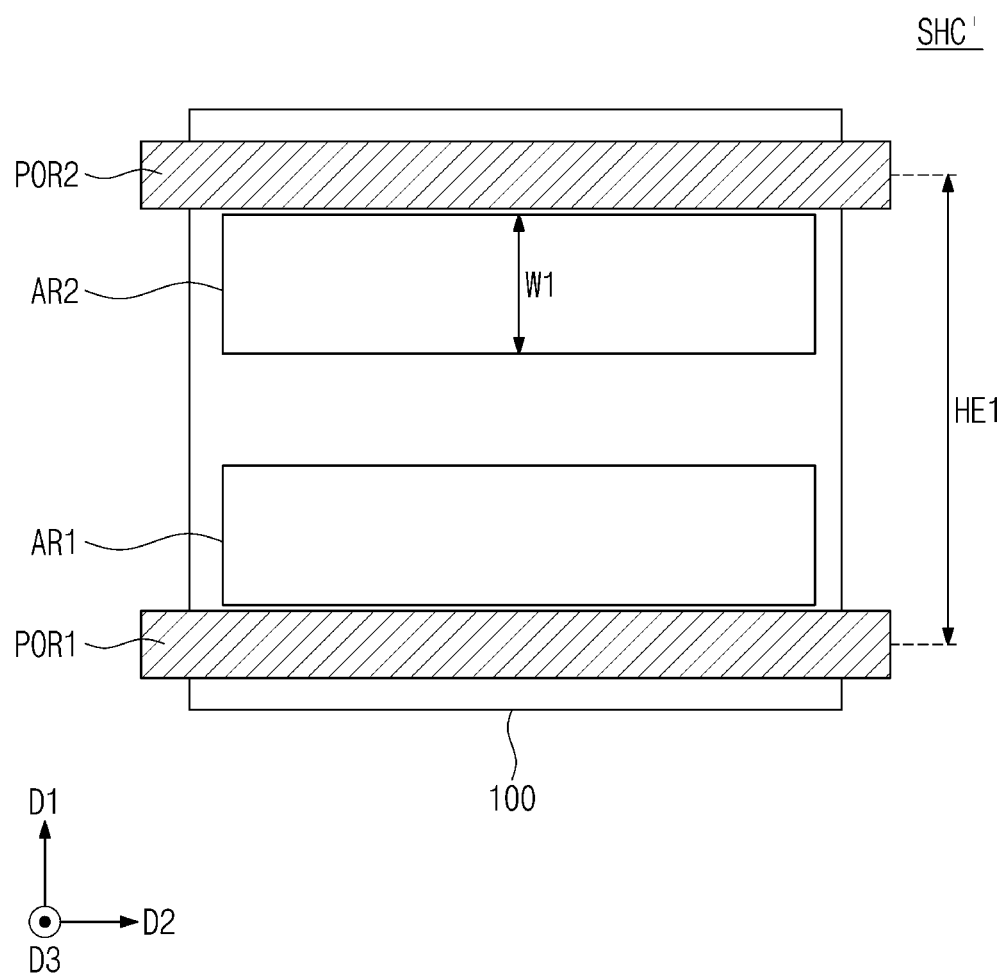
FIG. 1 is a conceptual diagram illustrating a logic cell of a semiconductor device according to a comparative example.

FIG. 1 is a conceptual diagram illustrating a logic cell of a semiconductor device according to a comparative example. In detail, FIG. 1 illustrates a logic cell of a two-dimensional device according to the comparative example.

Referring to FIG. 1, a single height cell SHC' may be provided. In detail, a first power line POR1 and a second power line POR2 may be provided on a substrate 100. A drain voltage VDD (i.e., a power voltage) may be applied to one of the first and second power lines POR1 and POR2. A source voltage VSS (i.e., a ground voltage) may be applied to the other of the first and second power lines POR1 and POR2. In an example embodiment, the source voltage VSS may be applied to the first power line POR1, and the drain voltage VDD may be applied to the second power line POR2.

The single height cell SHC' may be defined between the first power line POR1 and the second power line POR2. The single height cell SHC' may include a first active region AR1 and a second active region AR2. One of the first and second active regions AR1 and AR2 may be a p-type metal-oxide-semiconductor field-effect transistor (PMOSFET) region, and the other of the first and second active regions AR1 and AR2 may be an n-type metal-oxide-semiconductor field-effect transistor (NMOSFET) region. As an example, the first active region AR1 may be the NMOSFET region, and the second active region AR2 may be the PMOSFET region. In this regard, the single height cell SHC' may have a complementary metal-oxide-semiconductor (CMOS) structure provided between the first power line POR1 and the second power line POR2.

The semiconductor device according to the comparative example may be a two-dimensional device, in which transistors of a front-end-of-line (FEOL) layer are two-dimensionally arranged. For example, NMOSFETs of the first active region AR1 and PMOSFETs of the second active region AR2 may be formed to be spaced apart from each other in a first direction D1.

Each of the first and second active regions AR1 and AR2 may have a first width W1 in the first direction D1. In the comparative example, a length of the single height cell SHC' in the first direction D1 may be defined as a first height HE1. The first height HE1 may be substantially equal to a distance (e.g., pitch) between the first and second power lines POR1 and POR2.

The single height cell SHC' may constitute a single logic cell. In the present specification, the logic cell may indicate a logic device (e.g., AND, OR, XOR, XNOR, inverter, and so forth), which is configured to execute a specific function. In this regard, the logic cell may include transistors constituting the logic device and interconnection lines connecting the transistors to each other.

Because the single height cell SHC' according to the comparative example includes a two-dimensional device, the first active region AR1 and the second active region AR2 may not be overlapped with each other and may be arranged to be spaced apart from each other in the first direction D1. Thus, the first height HE1 of the single height cell SHC' should be defined in such a way that both of the first and second active regions AR1 and AR2, which are spaced apart from each other in the first direction D1, are included in the single height cell SHC'. As a result, the first height HE1 of the single height cell SHC' according to the comparative example should have a relatively large value. In this regard, the single height cell SHC' according to the comparative example may have a relatively large area.

Figure 2:
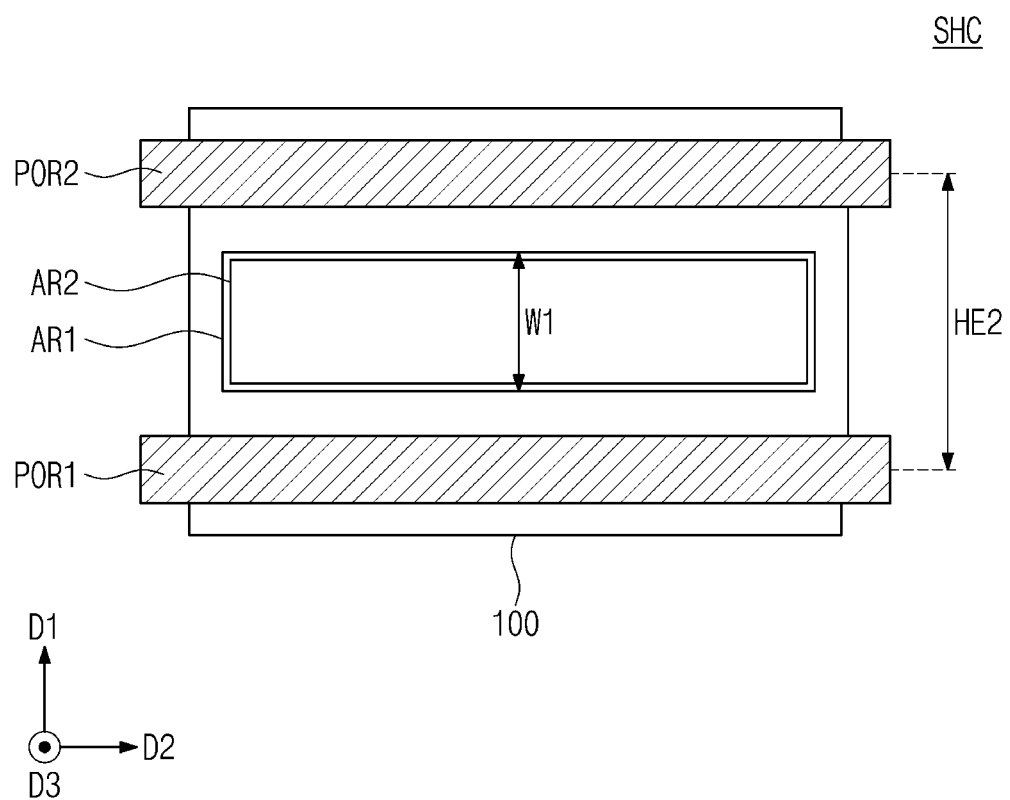
FIG. 2 is a conceptual diagram illustrating a logic cell of a semiconductor device according to an example embodiment.

FIG. 2 is a conceptual diagram illustrating a logic cell of a semiconductor device according to an example embodiment. In detail. FIG. 2 illustrates a logic cell of a three-dimensional device according to an example embodiment.

Referring to FIG. 2, a single height cell SHC including a three-dimensional device (e.g., with stacked transistors) may be provided. In detail, the first power line POR1 and the second power line POR2 may be provided on the substrate 100. The single height cell SHC may be defined between the first power line POR1 and the second power line POR2.

The single height cell SHC may include the first and second active regions AR1 and AR2. One of the first and second active regions AR1 and AR2 may be a PMOSFET region, and the other of the first and second active regions AR1 and AR2 may be an NMOSFET region.

The semiconductor device may be a three-dimensional device, in which transistors of an FEOL layer are vertically stacked. The first active region AR1 may be a bottom tier provided on the substrate 100, and the second active region AR2 may be a top tier stacked on the first active region AR1. For example, NMOSFETs of the first active region AR1 may be provided on the substrate 100, and PMOSFETs of the second active region AR2 may be stacked on the NMOSFETs. The first active region AR1 and the second active region AR2 may be spaced apart from each other in a vertical direction (i.e., a third direction D3).

Each of the first and second active regions AR1 and AR2 may have a first width W1 in the first direction D1. A length of the single height cell SHC in the first direction D1 may be defined as a second height HE2.

Because the single height cell SHC includes the three-dimensional device (i.e., the stacked transistors), the first active region AR1 may be overlapped with the second active region AR2. Thus, the second height HE2 of the single height cell SHC may be designed to be slightly larger than a width of a single active region (i.e., the first width W1). As a result, the second height HE2 of the single height cell SHC may be smaller than the first height HE1 of the single height cell SHC' described with reference to FIG. 1. In this regard, the single height cell SHC may have a relatively small area. In the three-dimensional semiconductor device, it may be possible to reduce an area for the logic cell and thereby to increase an integration density of the semiconductor device.

Figure 3:
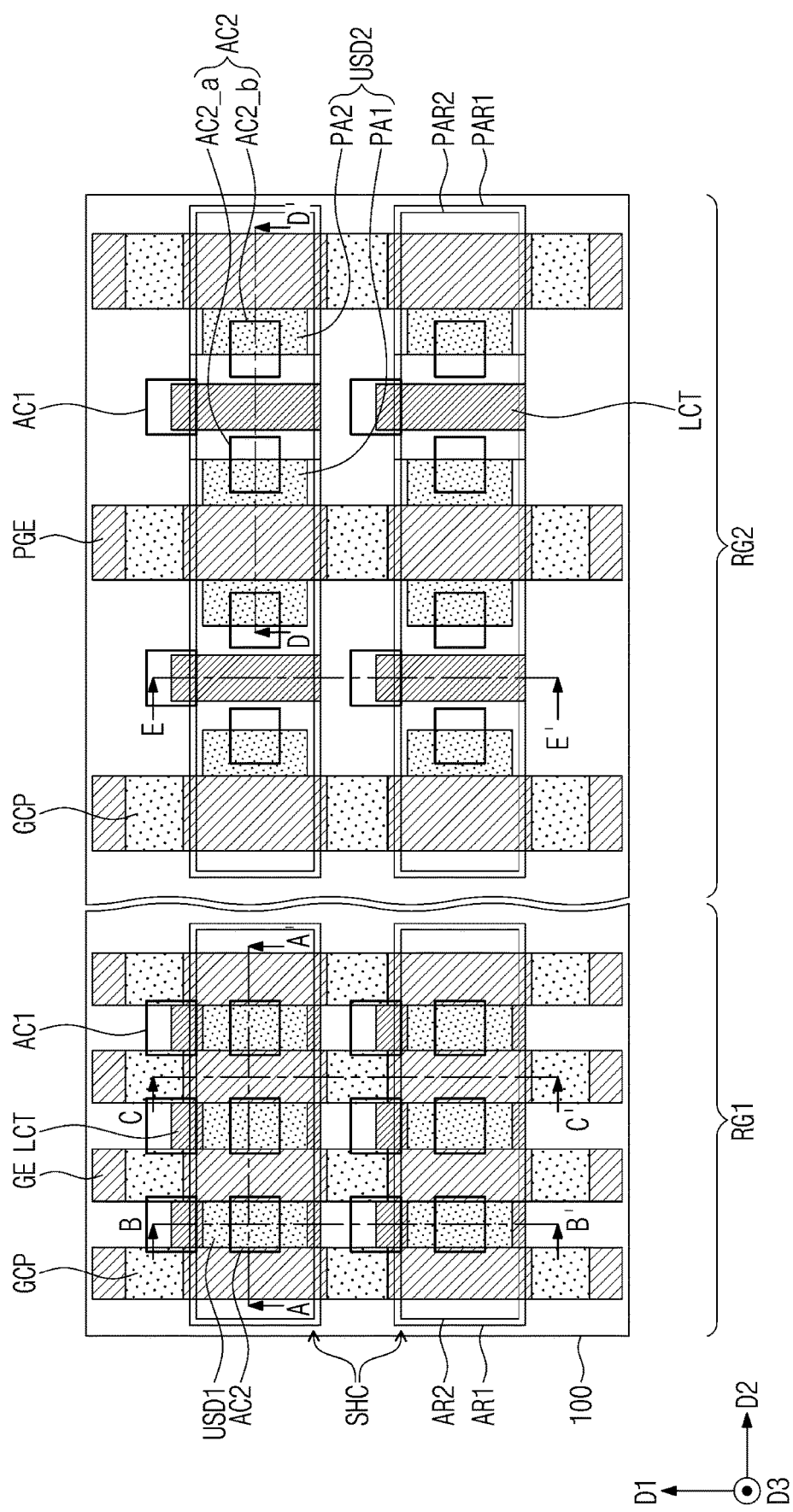
FIG. 3 is a plan view illustrating a three-dimensional semiconductor device according to an example embodiment.

FIG. 3 is a plan view illustrating a three-dimensional semiconductor device according to an example embodiment. FIGS. 4A to 4E are sectional views taken along lines A-A', B-B', C-C', D-D', and E-E' of FIG. 3. The three-dimensional semiconductor device of FIGS. 3 and 4A to 4C may be a detailed example of the single height cell shown in FIG. 2.

Referring to FIG. 3, the substrate 100 including a first region RG1 and a second region RG2 may be provided. The substrate 100 may be a semiconductor substrate, which is formed of, or includes, silicon, germanium, silicon germanium, or compound semiconductor materials. In an example embodiment, the substrate 100 may be a silicon wafer.

In an example embodiment, the first region RG1 may be a cell region, in which a logic cell constituting a logic circuit is disposed. As an example, the single height cells SHC previously described with reference to FIG. 2 may be provided in the first region RG1. The single height cells SHC may be adjacent to each other in the first direction D1.

In an example embodiment, the second region RG2 may be a peripheral region, in which transistors constituting a processor core or I/O terminals are disposed. For example, the second region RG2 may be a core/peripheral region of a logic die. The second region RG2 may include a long gate transistor (or a long channel transistor) whose gate length (i.e., channel length) is relatively long. The transistor in the second region RG2 may be operated under high power condition, compared with the transistor in the first region RG1. The transistor in the first region RG1 may be a single gate (SG) device. A transistor in the second region RG2 may be an extra gate (EG) device.

Hereinafter, the three-dimensional transistor in the first region RG1 will be described in more detail with reference to FIGS. 3 and 4A to 4C. The single height cell SHC, which is the logic cell, may include the first and second active regions AR1 and AR2, which are sequentially stacked on the substrate 100. One of the first and second active regions AR1 and AR2 may be a PMOSFET region, and the other of the first and second active regions AR1 and AR2 may be an NMOSFET region. The first active region AR1 may be provided in a bottom tier of the FEOL layer, and the second active region AR2 may be provided in a top tier of the FEOL layer. The NMOS- and PMOS-FETs of the first and second active regions AR1 and AR2 may be vertically stacked to form a three-dimensional stack transistor. In an example embodiment, the first active region AR1 may be an NMOSFET region, and the second active region AR2 may be a PMOSFET region.

A first active pattern AP1 may be defined by a trench TR, which is formed in an upper portion of the substrate 100. The first active pattern AP1 may be a vertically-protruding portion of the substrate 100. When viewed in a plan view, the first active pattern AP1 may be a bar-shaped pattern, which is extended in a second direction D2. The first and second active regions AR1 and AR2 described above may be sequentially stacked on the first active pattern AP1.

A device isolation layer ST may fill the trench TR. The device isolation layer ST may include a silicon oxide layer. A top surface of the device isolation layer ST may be coplanar with or lower than a top surface of the first active pattern AP1. The device isolation layer ST may not cover first lower and upper channel patterns LCH1 and UCH1, which will be described below.

The first active region AR1, which includes the first lower channel patterns LCH1 and first lower source/drain patterns LSD1, may be provided on the first active pattern AP1. The first lower channel pattern LCH1 may be interposed between a pair of the first lower source/drain patterns LSD1. The first lower channel pattern LCH1 may connect the pair of the first lower source/drain patterns LSD1 to each other.

The first lower channel pattern LCH1 may include a first semiconductor pattern SP1 and a second semiconductor pattern SP2, which are stacked to be spaced apart from each other. Each of the first and second semiconductor patterns SP1 and SP2 may be formed of or include at least one of silicon (Si), germanium (Ge), or silicon germanium (SiGe). In an example embodiment, each of the first and second semiconductor patterns SP1 and SP2 may be formed of or include crystalline silicon.

The first lower source/drain patterns LSD1 may be provided on the top surface of the first active pattern AP1. Each of the first lower source/drain patterns LSD1 may be an epitaxial pattern, which is formed by a selective epitaxial growth (SEG) process. In an example embodiment, a top surface of the first lower source/drain pattern LSD1 may be higher than a top surface of the second semiconductor pattern SP2 of the first lower channel pattern LCH1.

The first lower source/drain patterns LSD1 may be doped with impurities to have a first conductivity type. The first conductivity type may be an n- or p-type. In some example embodiments, the first conductivity type may be the n-type. The first lower source/drain patterns LSD1 may be formed of or include silicon (Si) and/or silicon germanium (SiGe).

Figure 4A:
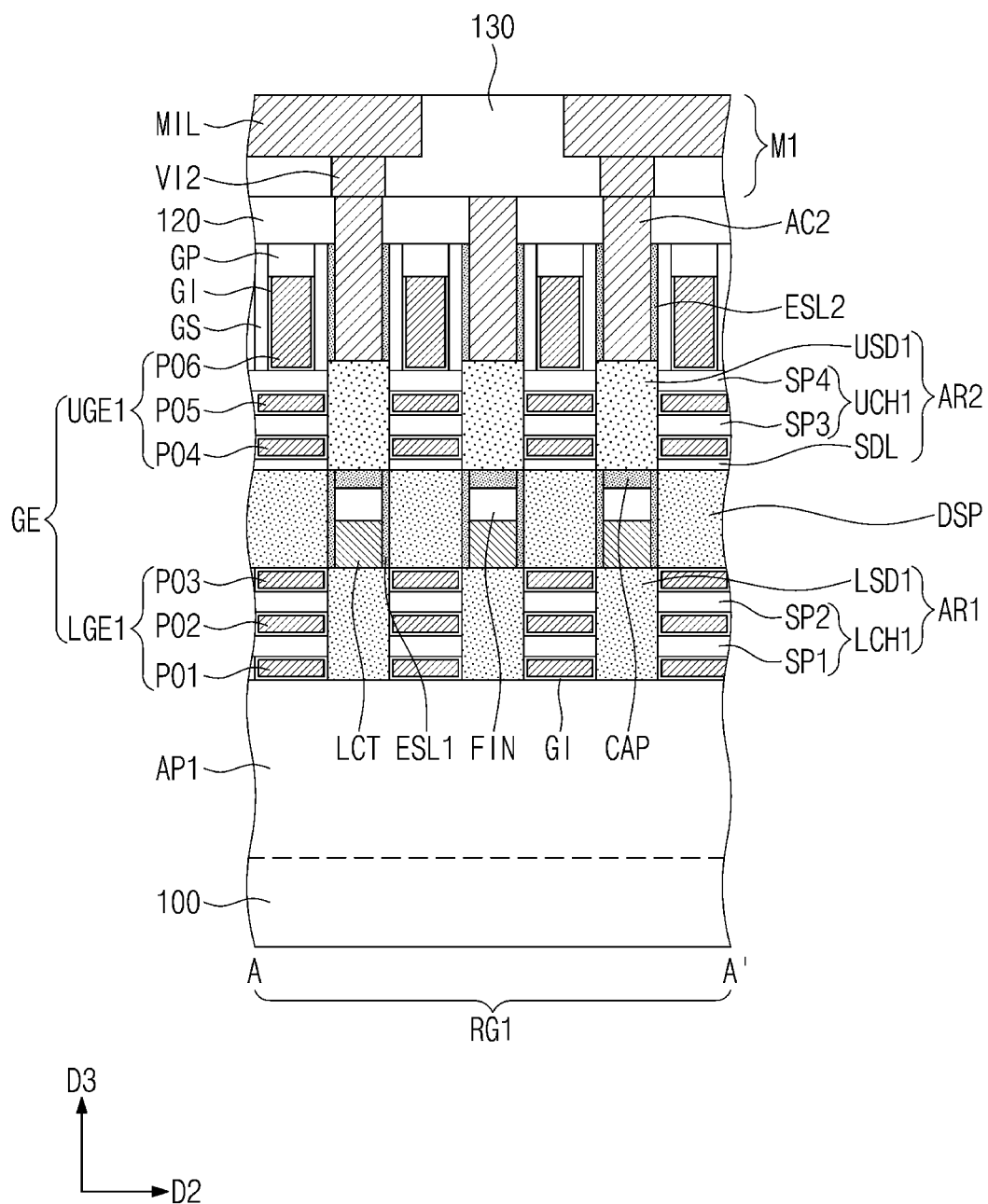
FIGS. 4A, 4B, 4C, 4D and 4E are sectional views taken along lines A-A', B-B', C-C', D-D', and E-E' of FIG. 3.
Figure 4B:
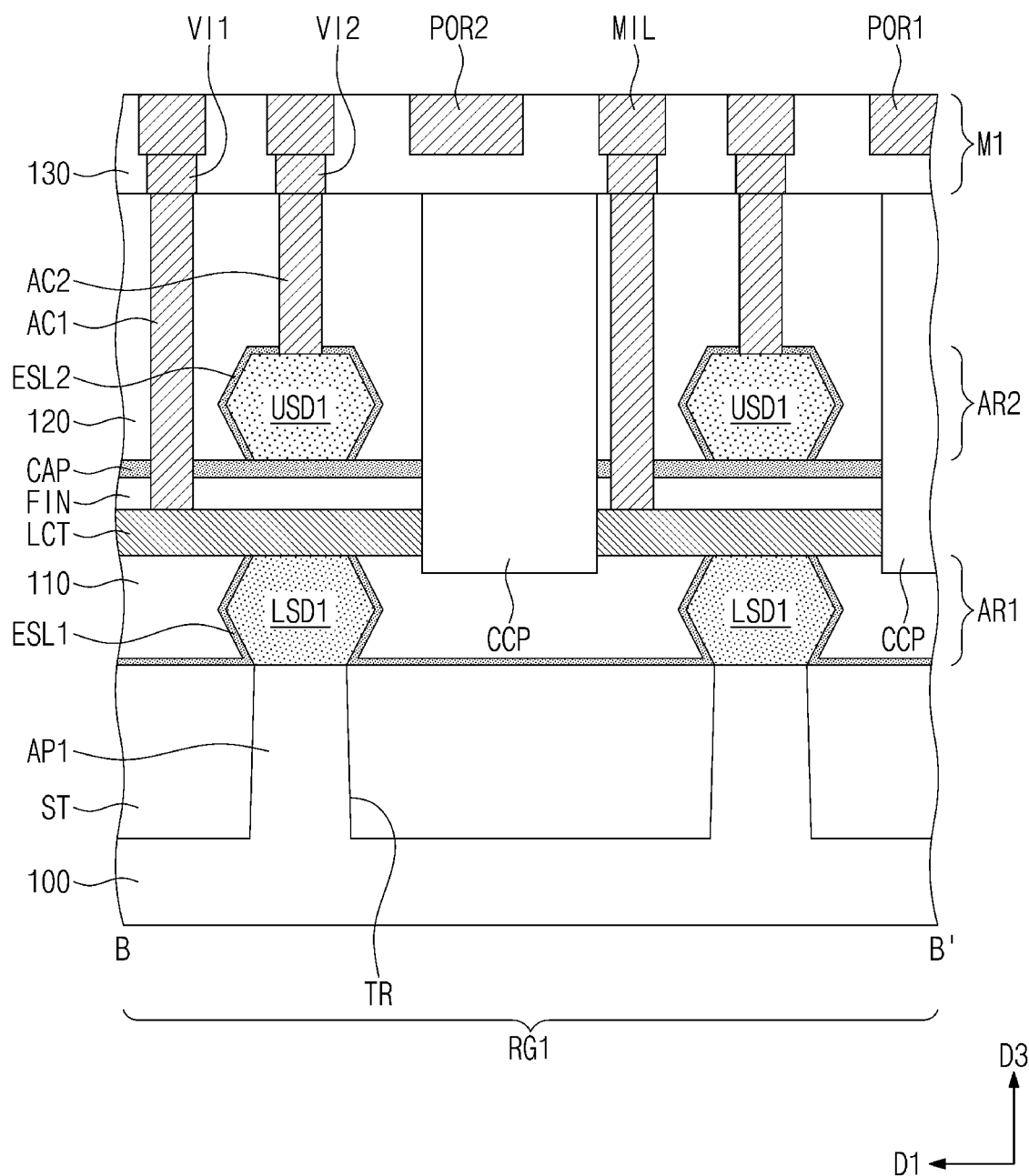
Figure 4C:
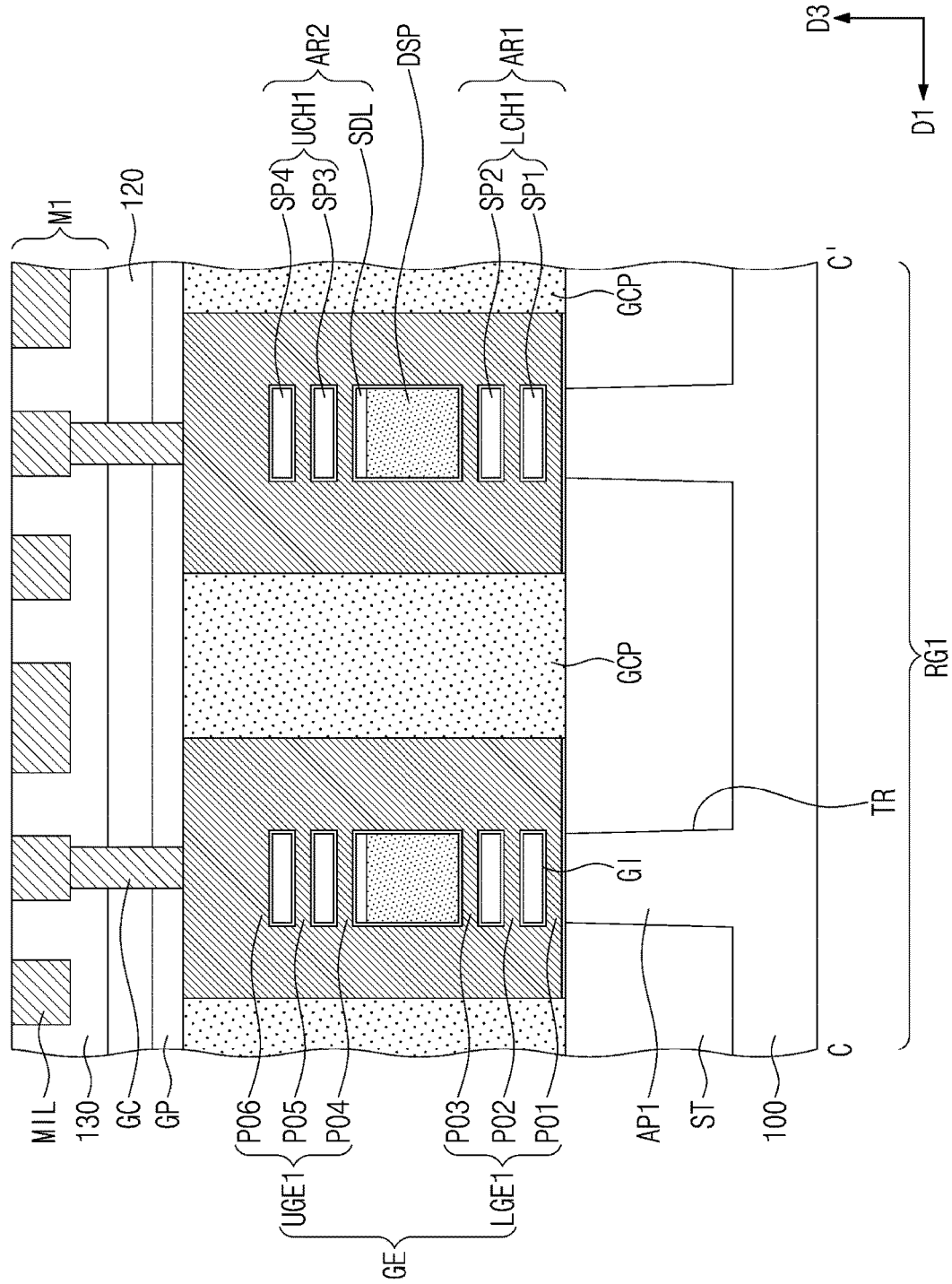

A first etch stop layer ESL1 may be provided on the first lower source/drain patterns LSD1 (e.g., see FIG. 4B). A first interlayer insulating layer 110 may be provided on the first etch stop layer ESL1. The first interlayer insulating layer 110 may cover the first lower source/drain patterns LSD1.

A lower contact LCT may be provided on the first lower source/drain pattern LSD1. The lower contact LCT may be electrically connected to the first lower source/drain pattern LSD1. The lower contact LCT may be a bar-shaped pattern extending in the first direction D1 (e.g., see FIG. 4B). The lower contact LCT may be formed of or include at least one metallic material that is selected from the group consisting of copper (Cu), aluminum (Al), ruthenium (Ru), cobalt (Co), tungsten (W), and molybdenum (Mo). The lower contact LCT may be covered with the first interlayer insulating layer 110.

A capping pattern CAP may be provided on the lower contact LCT. The capping pattern CAP may be vertically overlapped with the lower contact LCT. The capping pattern CAP may be provided below a second etch stop layer ESL2. The capping pattern CAP may be connected to the second etch stop layer ESL2 (e.g., see FIG. 4B).

A second interlayer insulating layer 120 and the second active region AR2 may be provided on the first interlayer insulating layer 110. The second active region AR2 may include first upper channel patterns UCH1 and first upper source/drain patterns USD1. The first upper channel patterns UCH1 may be vertically overlapped with the first lower channel patterns LCH1, respectively. The first upper source/drain patterns USD1 may be vertically overlapped with the first lower source/drain patterns LSD1, respectively. The first upper channel pattern UCH1 may be interposed between a pair of the first upper source/drain patterns USD1. The first upper channel pattern UCH1 may connect the pair of the first upper source/drain patterns USD1 to each other.

The first upper channel pattern UCH1 may include a third semiconductor pattern SP3 and a fourth semiconductor pattern SP4, which are stacked to be spaced apart from each other. The third and fourth semiconductor patterns SP3 and SP4 of the first upper channel pattern UCH1 may be formed of or include the same semiconductor material as the first and second semiconductor patterns SP1 and SP2 of the first lower channel pattern LCH1 described above.

At least one dummy channel pattern DSP may be interposed between the first lower channel pattern LCH1 and the first upper channel pattern UCH1 thereon. A seed layer SDL may be interposed between the dummy channel pattern DSP and the first upper channel pattern UCH1.

The dummy channel pattern DSP may be spaced apart from the first lower and upper source/drain patterns LSD1 and USD1. In this regard, the dummy channel pattern DSP may not be connected to any source/drain pattern. The dummy channel pattern DSP may be formed of or include at least one of semiconductor materials (e.g., silicon (Si), germanium (Ge), or silicon germanium (SiGe)) or silicon-based insulating materials (e.g., silicon oxide or silicon nitride). In an example embodiment, the dummy channel pattern DSP may be formed of or include at least one of the silicon-based insulating materials.

The first upper source/drain patterns USD1 may be provided on a top surface of the first interlayer insulating layer 110. The first upper source/drain patterns USD1 may be provided on a second etch stop layer ELS2 covering the top surface of the first interlayer insulating layer 110 (e.g., see FIG. 4B). Each of the first upper source/drain patterns USD1 may be an epitaxial pattern, which is formed by selective epitaxial growth (SEG) process. In an example embodiment, a top surface of the first upper source/drain pattern USD1 may be higher than a top surface of the fourth semiconductor pattern SP4 of the first upper channel pattern UCH1.

The first upper source/drain patterns USD1 may be doped with impurities to have a second conductivity type. The second conductivity type may be different from the first conductivity type of the first lower source/drain pattern LSD1. In some example embodiments, the second conductivity type may be a p-type. The first upper source/drain patterns USD1 may be formed of or include silicon germanium (SiGe) and/or silicon (Si).

The second interlayer insulating layer 120 may be provided on the second etch stop layer ESL2. The second interlayer insulating layer 120 may cover the first upper source/drain patterns USD1. A top surface of the second interlayer insulating layer 120 may be coplanar with a top surface of each of first and second active contacts AC1 and AC2, which will be described below.

A plurality of gate electrodes GE may be provided on the first region RG1. In detail, the gate electrode GE may be provided on the stacked first lower and upper channel patterns LCH1 and UCH1 (e.g., see FIG. 4C). When viewed in a plan view, the gate electrode GE may be a bar-shaped pattern, which is extended in the first direction D1. The gate electrode GE may be vertically overlapped with the stacked first lower and upper channel patterns LCH1 and UCH1.

The gate electrode GE may be extended from the top surface of the device isolation layer ST (or the top surface of the first active pattern AP1) to a gate capping pattern GP in a vertical direction (i.e., the third direction D3). The gate electrode GE may be extended from the first lower channel pattern LCH1 of the first active region AR1 to the first upper channel pattern UCH1 of the second active region AR2 in the third direction D3. The gate electrode GE may be extended from the lowermost one of the first semiconductor patterns SP1 to the uppermost one of the fourth semiconductor patterns SP4 in the third direction D3.

The gate electrode GE may be provided on a top surface, a bottom surface, and opposite side surfaces of each of the first to fourth semiconductor patterns SP1 to SP4. That is, the transistor may include a three-dimensional field effect transistor (e.g., MBCFET or GAAFET) in which the gate electrode GE is provided to three-dimensionally surround the channel patterns.

The gate electrode GE may include a first lower gate electrode LGE1, which is provided in the bottom tier of the FEOL layer (i.e., the first active region AR1), and a first upper gate electrode UGE1, which is provided in the top tier of the FEOL layer (i.e., the second active region AR2). The first lower gate electrode LGE1 and the first upper gate electrode UGE1 may be vertically overlapped with each other. The first lower gate electrode LGE1 and the first upper gate electrode UGE1 may be connected to each other. In this regard, the gate electrode GE may be a common gate electrode, in which the first lower gate electrode LGE1 on the first lower channel pattern LCH1 is connected to the first upper gate electrode UGE1 on the first upper channel pattern UCH1.

The first lower gate electrode LGE1 may include a first portion PO1 interposed between the first active pattern AP1 and the first semiconductor pattern SP1, a second portion PO2 interposed between the first semiconductor pattern SP1 and the second semiconductor pattern SP2, and a third portion PO3 interposed between the second semiconductor pattern SP2 and the dummy channel pattern DSP.

The first upper gate electrode UGE1 may include a fourth portion PO4 interposed between the dummy channel pattern DSP (or the seed layer SDL) and the third semiconductor pattern SP3, a fifth portion PO5 interposed between the third semiconductor pattern SP3 and the fourth semiconductor pattern SP4, and a sixth portion PO6 on the fourth semiconductor pattern SP4.

A pair of gate spacers GS may be disposed on opposite side surfaces of the gate electrode GE, respectively. Referring to FIG. 4A, a pair of the gate spacers GS may be respectively disposed on opposite side surfaces of the sixth portion PO6. The gate spacers GS may be extended along the gate electrode GE and in the first direction D1. Top surfaces of the gate spacers GS may be higher than a top surface of the gate electrode GE. The top surfaces of the gate spacers GS may be coplanar with the top surface of the second interlayer insulating layer 120. The gate spacers GS may be formed of or include at least one of SiCN, SiCON, or SiN. In an example embodiment, the gate spacers GS may have a multi-layered structure, which are formed of at least two different materials selected from SiCN, SiCON, and SiN.

The gate capping pattern GP may be provided on the top surface of the gate electrode GE. The gate capping pattern GP may be extended along the gate electrode GE in the first direction D1. For example, the gate capping pattern GP may be formed of or include at least one of SiON, SiCN, SiCON, or SiN. The second etch stop layer ESL2 may be provided on the gate capping pattern GP and the gate spacer GS.

A gate insulating layer GI may be interposed between the gate electrode GE and the first to fourth semiconductor patterns SP1-SP4. The gate insulating layer GI may include a silicon oxide layer, a silicon oxynitride layer, and/or a high-k dielectric layer. In an example embodiment, the gate insulating layer GI may include a silicon oxide layer, which is formed to directly cover a surface of the semiconductor pattern SP1-SP4, and a high-k dielectric layer, which is formed on the silicon oxide layer. In this regard, the gate insulating layer GI may be a multi-layered structure including the silicon oxide layer and the high-k dielectric layer.

The high-k dielectric layer may be formed of or include a high-k dielectric material whose dielectric constant is higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The first lower gate electrode LGE1 may include a first work function metal pattern on the first and second semiconductor patterns SP1 and SP2. The first upper gate electrode UGE1 may include a second work function metal pattern on the third to fourth semiconductor patterns SP3 and SP4. Each of the first and second work function metal patterns may be formed of a material, which contains at least one metallic element, which is selected from the group consisting of titanium (Ti), tantalum (Ta), aluminum (Al), tungsten (W), and molybdenum (Mo), and nitrogen (N). The first and second work function metal patterns may have different work functions from each other. The gate electrode GE may include at least one of low resistance metals (e.g., tungsten (W), ruthenium (Ru), aluminum (Al), titanium (Ti), and tantalum (Ta)) on the first and second work function metal patterns. For example, the sixth portion PO6 may be formed of or include the low resistance metal.

A gate cutting pattern GCP may be provided to penetrate the gate electrode GE. The gate electrodes GE, which are adjacent to each other in the first direction D1, may be separated from each other by the gate cutting pattern GCP. For example, referring to FIG. 4C, a pair of the gate cutting patterns GCP may be respectively provided at opposite end portions of the gate electrode GE. The gate cutting pattern GCP may be formed of or include at least one of insulating materials (e.g., silicon oxide, silicon nitride, or combinations thereof).

A contact cutting pattern CCP may be provided to penetrate the lower contact LCT. The lower contacts LCT, which are adjacent to each other in the first direction D1, may be separated from each other by the contact cutting pattern CCP. For example, referring to FIG. 4B, one lower contact LCT may be provided between a pair of contact cutting patterns CCP. The contact cutting pattern CCP may be formed of or include at least one of insulating materials (e.g., silicon oxide, silicon nitride, or combinations thereof).

A third interlayer insulating layer 130 may be provided on the second interlayer insulating layer 120. A gate contact GC may be provided to penetrate the third interlayer insulating layer 130, the second interlayer insulating layer 120, and the gate capping pattern GP and may be electrically connected to the gate electrode GE. The gate contact GC may be formed of or include at least one of metallic materials (e.g., copper (Cu), aluminum (Al), ruthenium (Ru), cobalt (Co), tungsten (W), and molybdenum (Mo)).

The first and second active contacts AC1 and AC2, which are electrically and respectively connected to the first lower and upper source/drain patterns LSD1 and USD1, may be provided. In detail, referring to FIG. 4B, the first active contact AC1 may be provided to penetrate the second interlayer insulating layer 120 and the second etch stop layer ELS2, and may be coupled to the lower contact LCT. The first active contact AC1 may be electrically connected to the first lower source/drain pattern LSD1 through the lower contact LCT. The second active contact AC2 may be provided to penetrate the second interlayer insulating layer 120 and the second etch stop layer ELS2, and may be directly connected to the first upper source/drain pattern USD1.

The first and second active contacts AC1 and AC2 may be formed of or include at least one of doped semiconductor materials and/or metallic materials. In an example embodiment, the metallic materials may include copper (Cu), aluminum (Al), ruthenium (Ru), cobalt (Co), tungsten (W), and molybdenum (Mo).

According to an example embodiment, the first lower and upper source/drain patterns LSD1 and USD1, which are overlapped with each other, may be electrically connected to the first and second active contacts AC1 and AC2, respectively, which are adjacent to each other. This connection is possible because the lower contact LCT extending in the first direction D1 is additionally provided on the first lower source/drain pattern LSD1. Even when the first active contact AC1 is offset from the first lower source/drain pattern LSD1 in the first direction D1, the first active contact AC1 may be electrically connected to the first lower source/drain pattern LSD1 through the lower contact LCT (e.g., see FIG. 4B).

A first metal layer M1 may be provided in the third interlayer insulating layer 130. The first metal layer M1 may include interconnection lines MIL and the afore-described first and second power lines POR1 and POR2. The interconnection lines MIL and the first and second power lines POR1 and POR2 may be formed of or include at least one of metallic materials (e.g., copper (Cu), aluminum (Al), ruthenium (Ru), cobalt (Co), tungsten (W), and molybdenum (Mo)).

In an example embodiment, the gate contact GC may be directly connected to the interconnection line MIL. The first active contact AC1 may be connected to the interconnection line MIL through a first via VI1. The second active contact AC2 may be connected to the interconnection line MIL through a second via VI2.

Additional metal layers (e.g., M2, M3, M4, and so forth) may be stacked on the first metal layer M1. The first metal layer M1 and the additional metal layers (e.g., M2, M3, M4, and so forth) thereon may constitute a back-end-of-line (BEOL) layer of the semiconductor device. The additional metal layers (e.g., M2, M3, M4, and so forth) on the first metal layer M1 may include routing lines, which are used to connect the logic cells to each other.

Figure 4D:
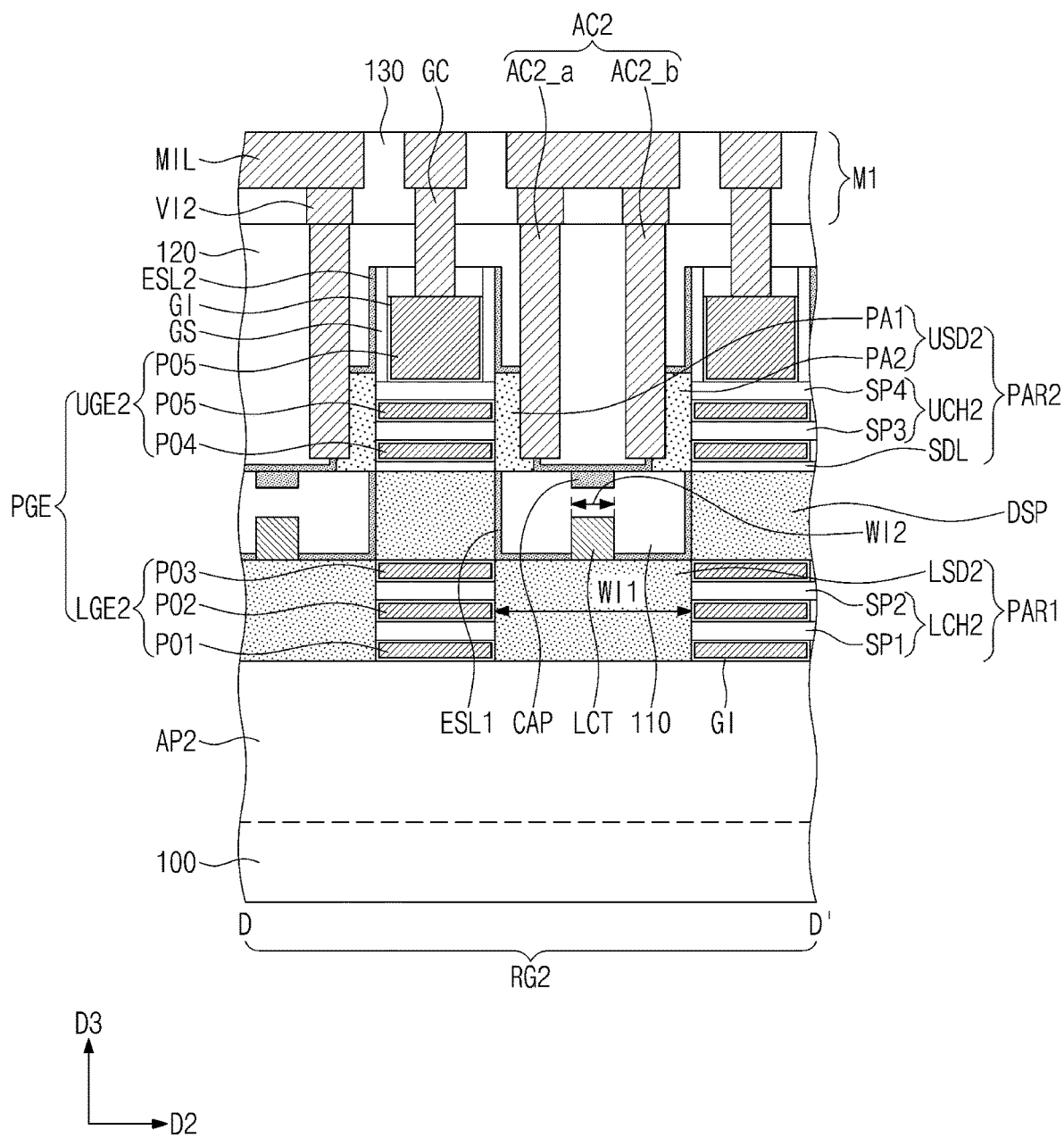
Figure 4E:
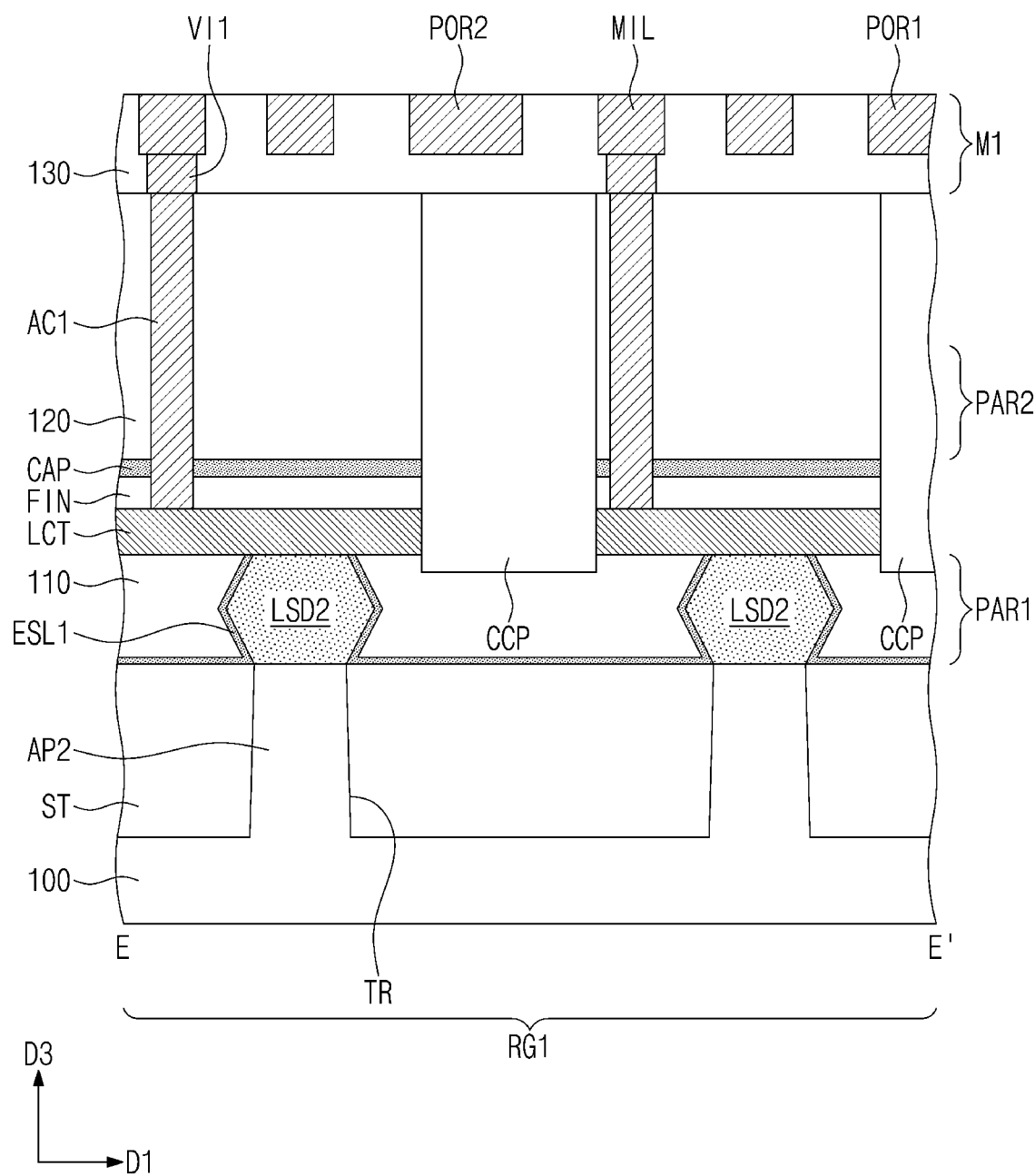

Hereinafter, the three-dimensional transistor in the second region RG2 will be described in more detail with reference to FIGS. 3, 4D, and 4E. The same features as the transistor in the first region RG1 described with reference to FIGS. 3 and 4A to 4C may be omitted in the following description, for the sake of brevity.

The second region RG2 may include a second active pattern AP2. A first peripheral active region PAR1 and a second peripheral active region PAR2 may be sequentially stacked on the second active pattern AP2. The first peripheral active region PAR1 may include second lower channel patterns LCH2 and second lower source/drain patterns LSD2. The second peripheral active region PAR2 may include second upper channel patterns UCH2 and second upper source/drain patterns USD2.

The second lower channel pattern LCH2 may include the first semiconductor pattern SP1 and the second semiconductor pattern SP2, which are stacked to be spaced apart from each other. The second upper channel pattern UCH2 may include the third semiconductor pattern SP3 and the fourth semiconductor pattern SP4, which are stacked to be spaced apart from each other.

A width of the second lower channel pattern LCH2 in the second direction D2 may be larger than a width, in the second direction D2, of the first lower channel pattern LCH1 on the first region RG1 described above. A width of the second upper channel pattern UCH2 may be larger than a width of the first upper channel pattern UCH1 on the first region RG1 described above. This is because a gate length (i.e., a channel length) of the second region RG2 is larger than a gate length (i.e., a channel length) of the first region RG1.

A width of the second lower source/drain pattern LSD2 in the second direction D2 may be larger than a width, in the second direction D2, of the first lower source/drain pattern LSD1 of the first region RG1 described above. For example, the width of the second lower source/drain pattern LSD2 may be larger than two times the width of the first lower source/drain pattern LSD1.

The lower contact LCT may be provided on the second lower source/drain pattern LSD2. A width WI2 of the lower contact LCT in the second direction D2 may be smaller than a width WI1 of the second lower source/drain pattern LSD2 in the second direction D2. For example, the ratio WI2/WI1 of the width WI2 of the lower contact LCT to the width WI1 of the second lower source/drain pattern LSD2 may range from 0.1 to 0.5.

A ratio of a width of the lower contact LCT to the afore-described width of the first lower source/drain pattern LSD1 on the first region RG1 may range from 0.8 to 1 (e.g., see FIG. 4A). That is, the ratio of the width of the lower contact LCT to the width of the first lower source/drain pattern LSD1 on the first region RG1 may be greater than a ratio of the width of the lower contact LCT to the width of the second lower source/drain pattern LSD2 on the second region RG2.

In the case where the width WI2 of the lower contact LCT is almost equal to the width WI1 of the second lower source/drain pattern LSD2, a parasitic capacitance may be greatly increased, due to an increase of the size of the lower contact LCT. This may lead to deterioration in electrical characteristics of the semiconductor device. By contrast, according to an example embodiment, the width WI2 of the lower contact LCT may be controlled to have a very small value, compared with the width WI1 of the second lower source/drain pattern LSD2. Thus, it may be possible to prevent the size of the lower contact LCT from being increased and thereby to reduce the parasitic capacitance, and thus, the electrical characteristics of the semiconductor device may be improved.

The capping pattern CAP may be provided on the lower contact LCT. The capping pattern CAP may be vertically overlapped with the lower contact LCT. The capping pattern CAP may be provided below the second etch stop layer ESL2. The capping pattern CAP may be connected to the second etch stop layer ESL2.

In an example embodiment, the capping pattern CAP may be formed of or include the same insulating material as the first and second etch stop layers ESL1 and ESL2. In an example embodiment, the capping pattern CAP may be formed of or include a material different from the first and second etch stop layers ESL1 and ESL2. For example, the capping pattern CAP may be formed of or include at least one of silicon oxide or low-k dielectric materials (e.g., the air or porous layers).

A gapfill insulating layer FIN may be interposed between the lower contact LCT and the capping pattern CAP. The gapfill insulating layer FIN may be formed of or include the same material as the first interlayer insulating layer 110. Thus, the gapfill insulating layer FIN and the first interlayer insulating layer 110 may be connected to each other to form a single object.

The second upper source/drain pattern USD2 may include a pair of sub-patterns PA1 and PA2. That is, the second upper source/drain pattern USD2 may include a first sub-pattern PA1 and a second sub-pattern PA2, which are separated from each other in the second direction D2.

Because a distance between peripheral gate electrodes PGE on the second region RG2 is larger than two times a distance between the gate electrodes GE on the first region RG1, there may be a difficulty in filling a region between the peripheral gate electrodes PGE with the second upper source/drain pattern USD2, unlike the first upper source/drain pattern USD1. Thus, the second upper source/drain pattern USD2 may be provided to include a pair of the sub-patterns PA1 and PA2, which are separated from each other and are respectively provided on the the second upper channel patterns UCH2.

A plurality of the peripheral gate electrodes PGE may be provided on the second region RG2. The peripheral gate electrode PGE may include a second lower gate electrode LGE2, which is provided in the first peripheral active region PAR1, and a second upper gate electrode UGE2, which is provided in the second peripheral active region PAR2.

The second lower gate electrode LGE2 may include a first portion PO1 interposed between the second active pattern AP2 and the first semiconductor pattern SP1, a second portion PO2 interposed between the first semiconductor pattern SP1 and the second semiconductor pattern SP2, and a third portion PO3 interposed between the second semiconductor pattern SP2 and the dummy channel pattern DSP.

The second upper gate electrode UGE2 may include a fourth portion PO4 interposed between the dummy channel pattern DSP (or the seed layer SDL) and the third semiconductor pattern SP3, a fifth portion PO5 interposed between the third semiconductor pattern SP3 and the fourth semiconductor pattern SP4, and the sixth portion PO6 on the fourth semiconductor pattern SP4.

The gate insulating layer GI may be interposed between the peripheral gate electrode PGE and the first to fourth semiconductor patterns SP1-SP4. In an example embodiment, a thickness of the gate insulating layer GI on the second region RG2 may be larger than a thickness of the gate insulating layer GI on the first region RG1.

In an example embodiment, the gate insulating layer GI on the second region RG2 may include a dipole element. The dipole element may include lanthanum (La), aluminum (Al), or combinations thereof. In this regard, the gate insulating layer GI of the second region RG2 may contain lanthanum (La), aluminum (Al), or combinations thereof as impurities.

In the case where the gate insulating layer GI on the second region RG2 contains lanthanum (La), an effective work function of the peripheral gate electrode PGE may be lowered. For example, the dipole element (La) may lead to an increase in a threshold voltage of a PMOS transistor. Similarly, the dipole element (La) may lead to a reduction in a threshold voltage of an NMOS transistor.

In an example embodiment, because the gate insulating layer GI on the second region RG2 further includes an additional dipole element, a threshold voltage of the EG device may be more easily controlled. As a result, the electrical characteristics of the semiconductor device may be improved. In an example embodiment, the gate insulating layer GI on the first region RG1 may also include the dipole element additionally. By differently adjusting the kind and concentration of the dipole elements, a threshold voltage of a transistor may be differently controlled for each region.

The second active contact AC2 may include a pair of contacts AC2_a and AC2_b. A first contact AC2_a may be electrically connected to the first sub-pattern PA1, and a second contact AC2_b may be electrically connected to the second sub-pattern PA2.

In an example embodiment, the first contact AC2_a may be extended from a top surface of the first sub-pattern PA1 along a side surface of the first sub-pattern PA1 in a downward direction. Thus, a contact area between the first contact AC2_a and the first sub-pattern PA1 may be increased, and this may result in a reduction of a contact resistance between the first contact AC2_a and the first sub-pattern PAL. Similarly, the second contact AC2_b may be extended from a top surface of the second sub-pattern PA2 along a side surface of the second sub-pattern PA2 in the downward direction.

The first and second contacts AC2_a and AC2_b may be connected in common to one of the interconnection lines MIL through the second vias VI2. The first and second contacts AC2_a and AC2_b may be electrically connected to each other through the interconnection line MIL. In this regard, the first and second sub-patterns PA1 and PA2, which are physically separated from each other, may be electrically connected to each other through the interconnection line MIL.

Referring back to FIG. 4B, in the first region RG1, the lower contact LCT and the first upper source/drain pattern USD1 may be overlapped with each other. Referring back to FIG. 4E, in the second region RG2, the lower contact LCT and the second upper source/drain pattern USD2 may not be overlapped with each other. As described above, the second upper source/drain pattern USD2 may be divided into a pair of the sub-patterns PA1 and PA2. When viewed in a plan view, the lower contact LCT may be located between the pair of the sub-patterns PA1 and PA2 (e.g., see FIG. 3).

FIGS. 5A to 13C are sectional views illustrating a method of fabricating a semiconductor device according to an example embodiment. In detail, FIGS. 5A, 6A, 7A, 8A, 9A, 10A, 11A, 12A, and 13A are sectional views corresponding to the line A-A' of FIG. 3. FIGS. 5B, 7B, 8B, 9B, 10B, 11B, and 13B are sectional views corresponding to the line B-B' of FIG. 3. FIGS. 6B and 12B are sectional views corresponding to the line C-C' of FIG. 3. FIGS. 5C, 6C, 7C, 8C, 9C, 10C, 11C, 12C, and 13C are sectional views corresponding to the line D-D' of FIG. 3.

Figure 5A:
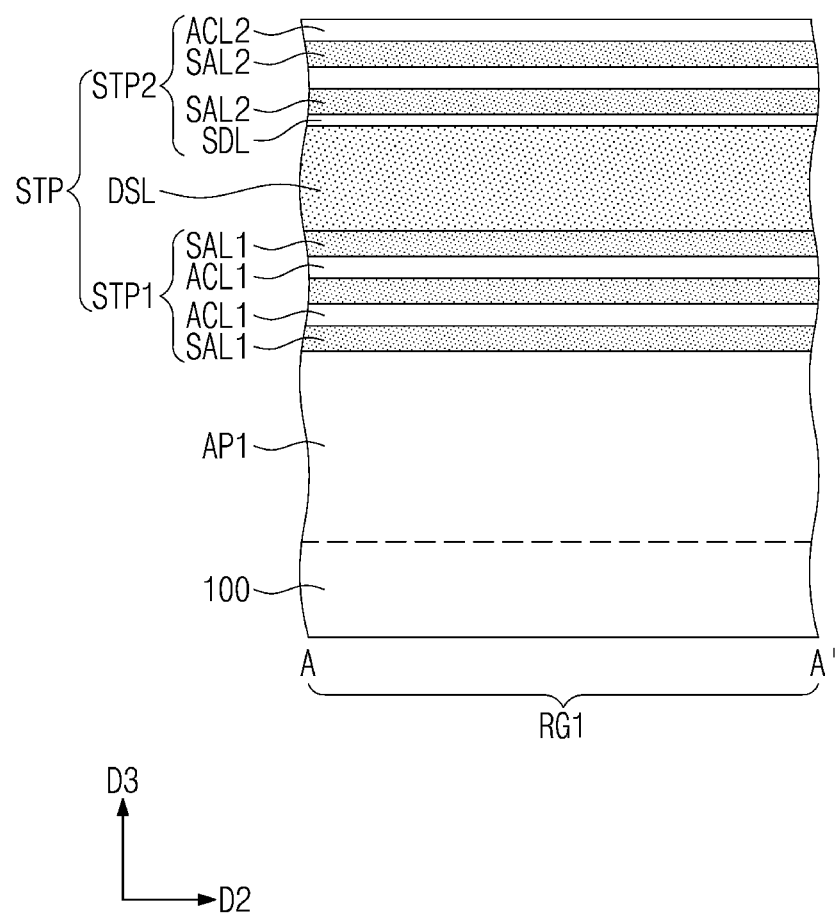
FIGS. 5A, 5B, 5C, 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B and 13C are sectional views illustrating a method of fabricating a semiconductor device according to an example embodiment.
Figure 5B:
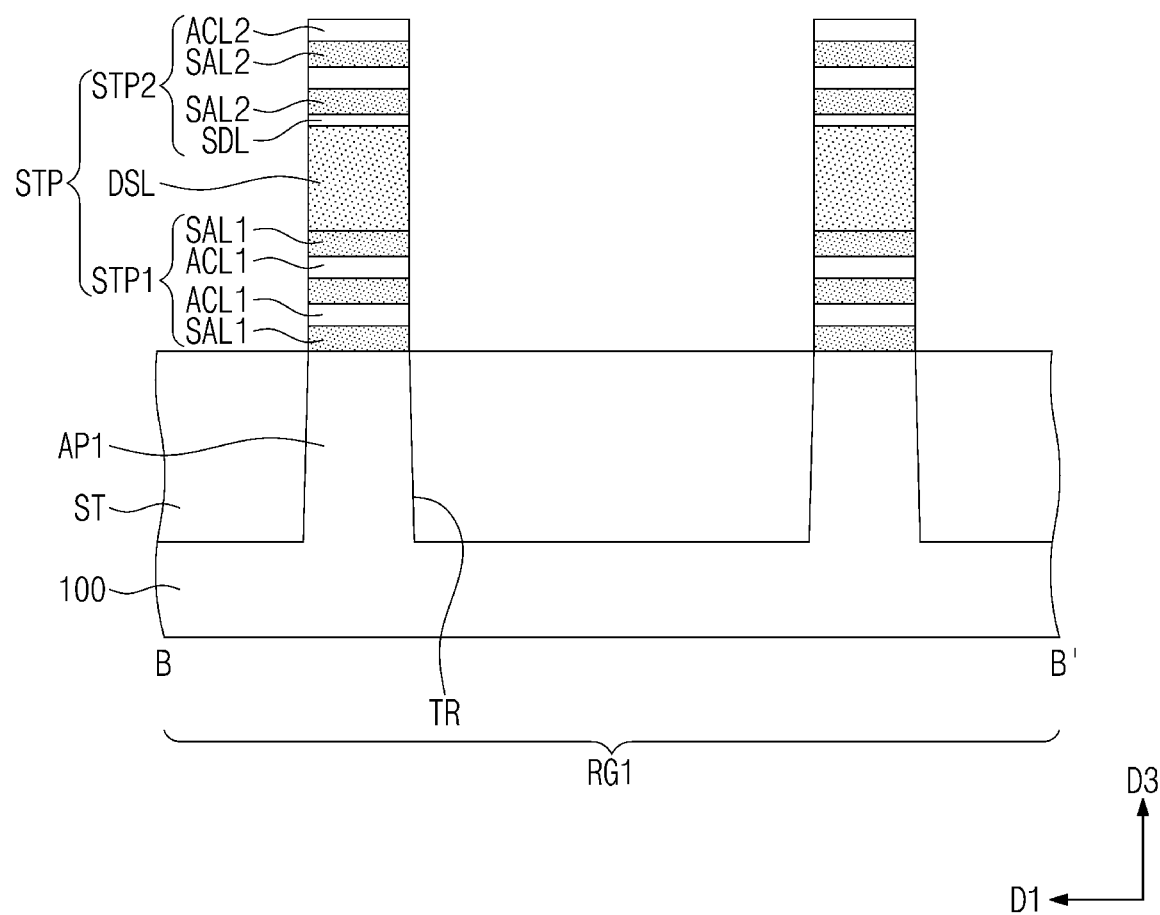
Figure 5C:
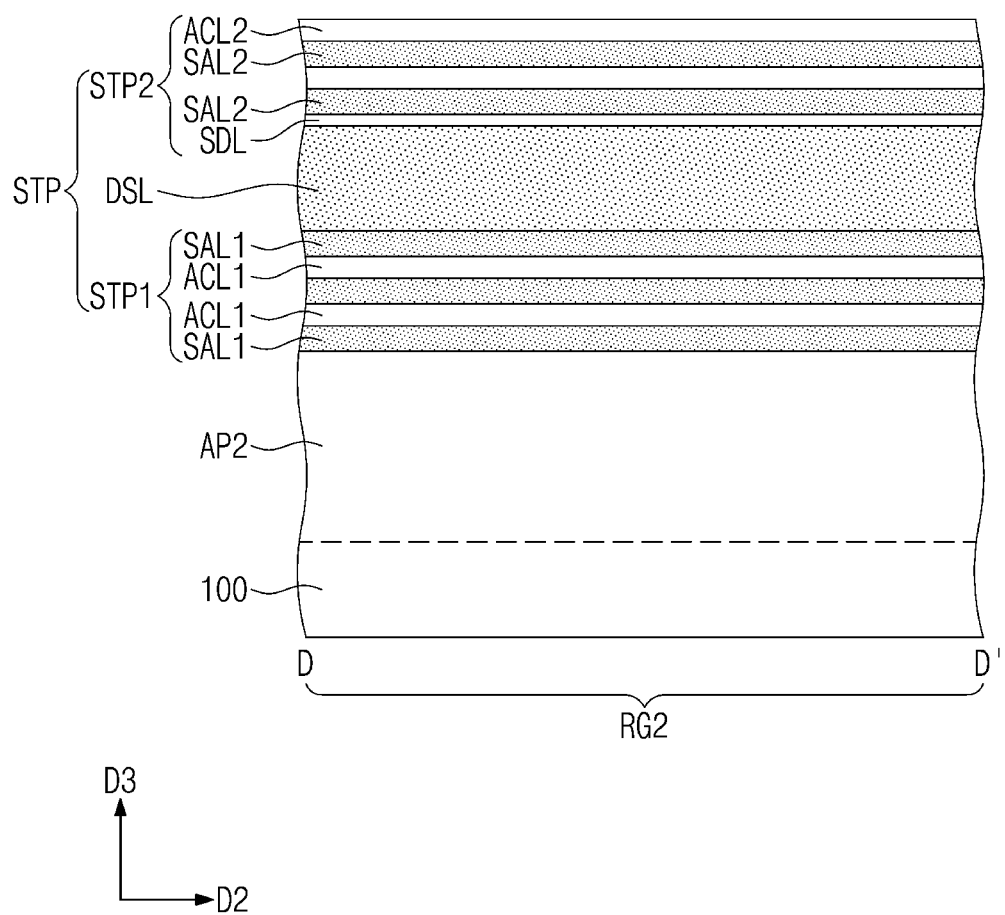

Referring to FIGS. 5A to 5C, first sacrificial layers SAL1 and first active layers ACL1 may be alternately stacked on the substrate 100. The first sacrificial layers SAL1 may be formed of or include at least one of silicon (Si), germanium (Ge), or silicon germanium (SiGe), and the first active layers ACL1 may be formed of or include another one of silicon (Si), germanium (Ge), and silicon germanium (SiGe). For example, the first sacrificial layers SAL1 may be formed of or include silicon germanium (SiGe), and the first active layers ACL1 may be formed of or include silicon (Si). A concentration of germanium (Ge) in each of the first sacrificial layers SAL1 may range from 10 at % to 30 at %.

A separation layer DSL may be formed on the uppermost one of the first sacrificial layers SAL1. In an example embodiment, a thickness of the separation layer DSL may be larger than a thickness of the first sacrificial layer SAL1. The separation layer DSL may be formed of or include silicon (Si) or silicon germanium (SiGe). In the case where the separation layer DSL includes silicon germanium (SiGe), a germanium concentration of the separation layer DSL may be higher than a germanium concentration of the first sacrificial layer SAL1. For example, the germanium concentration of the separation layer DSL may range from 40 at % to 90 at %.

The seed layer SDL may be formed on the separation layer DSL. The seed layer SDL may be formed of or include the same material as the first active layer ACL1. Second sacrificial layers SAL2 and second active layers ACL2 may be alternately stacked on the seed layer SDL. Each of the second sacrificial layers SAL2 may be formed of or include the same material as the first sacrificial layer SAL1, and each of the second active layers ACL2 may be formed of or include the same material as the first active layer ACL1. The separation layer DSL may be interposed between the first sacrificial layer SAL1 and the seed layer SDL.

A stacking pattern STP may be formed by patterning the first and second sacrificial layers SAL1 and SAL2, the first and second active layers ACL1 and ACL2, and the separation layer DSL which are stacked. The formation of the stacking pattern STP may include forming a hard mask pattern on the uppermost one of the second active layers ACL2 and etching the layers SAL1, SAL2, ACL1, ACL2, SDL, and DSL, which are stacked on the substrate 100, using the hard mask pattern as an etch mask. During the formation of the stacking pattern STP, an upper portion of the substrate 100 may be patterned to form the trench TR defining the first active pattern AP1. The stacking pattern STP may be a bar-shaped pattern extended in the second direction D2.

The stacking pattern STP may include a lower stacking pattern STP1 on the first active pattern AP1 of the first region RG1 and the second active pattern AP2 of the second region RG2, an upper stacking pattern STP2 on the lower stacking pattern STP1, and the separation layer DSL between the lower and upper stacking patterns STP1 and STP2. The lower stacking pattern STP1 may include the first sacrificial layers SAL1 and the first active layers ACL1 which are alternately stacked. The upper stacking pattern STP2 may include the seed layer SDL and the second sacrificial and active layers SAL2 and ACL2, which are alternatingly stacked on the seed layer SDL.

The device isolation layer ST may be formed on the substrate 100 to fill the trench TR. In detail, an insulating layer may be formed on the substrate 100 to cover the first and second active patterns AP1 and AP2 and the stacking patterns STP. The device isolation layer ST may be formed by recessing the insulating layer until the stacking patterns STP are exposed.

Figure 6A:
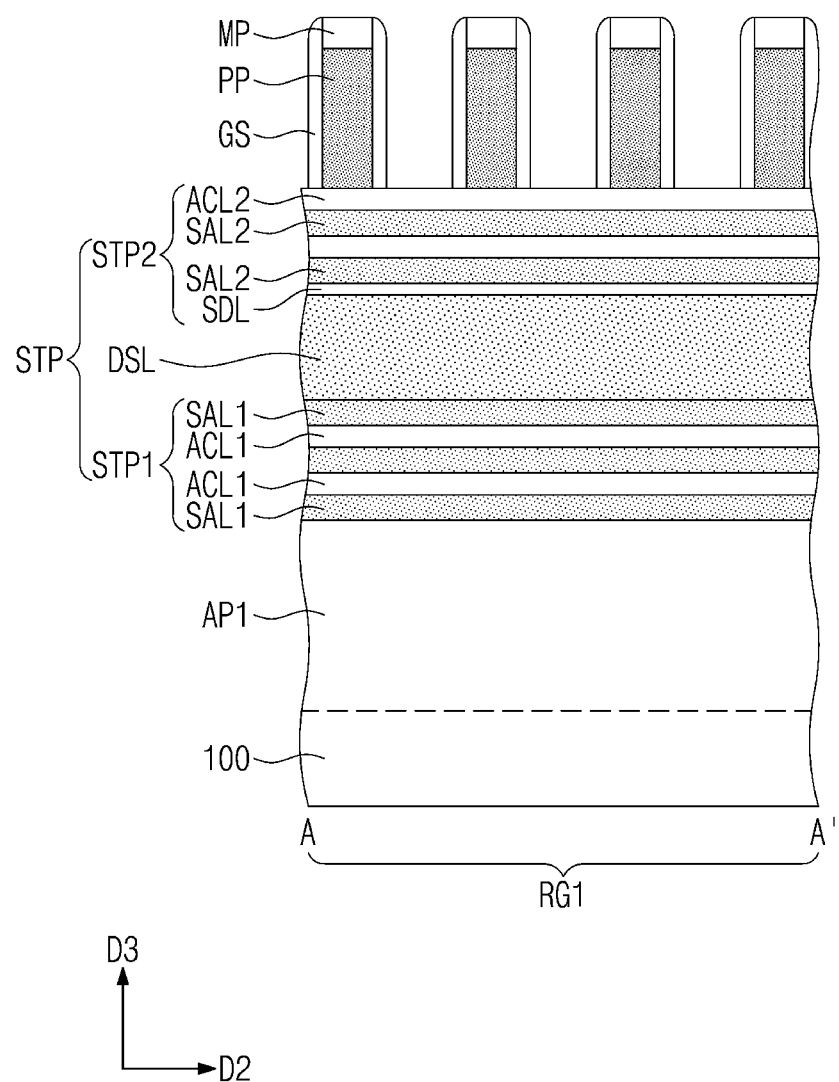
Figure 6B:
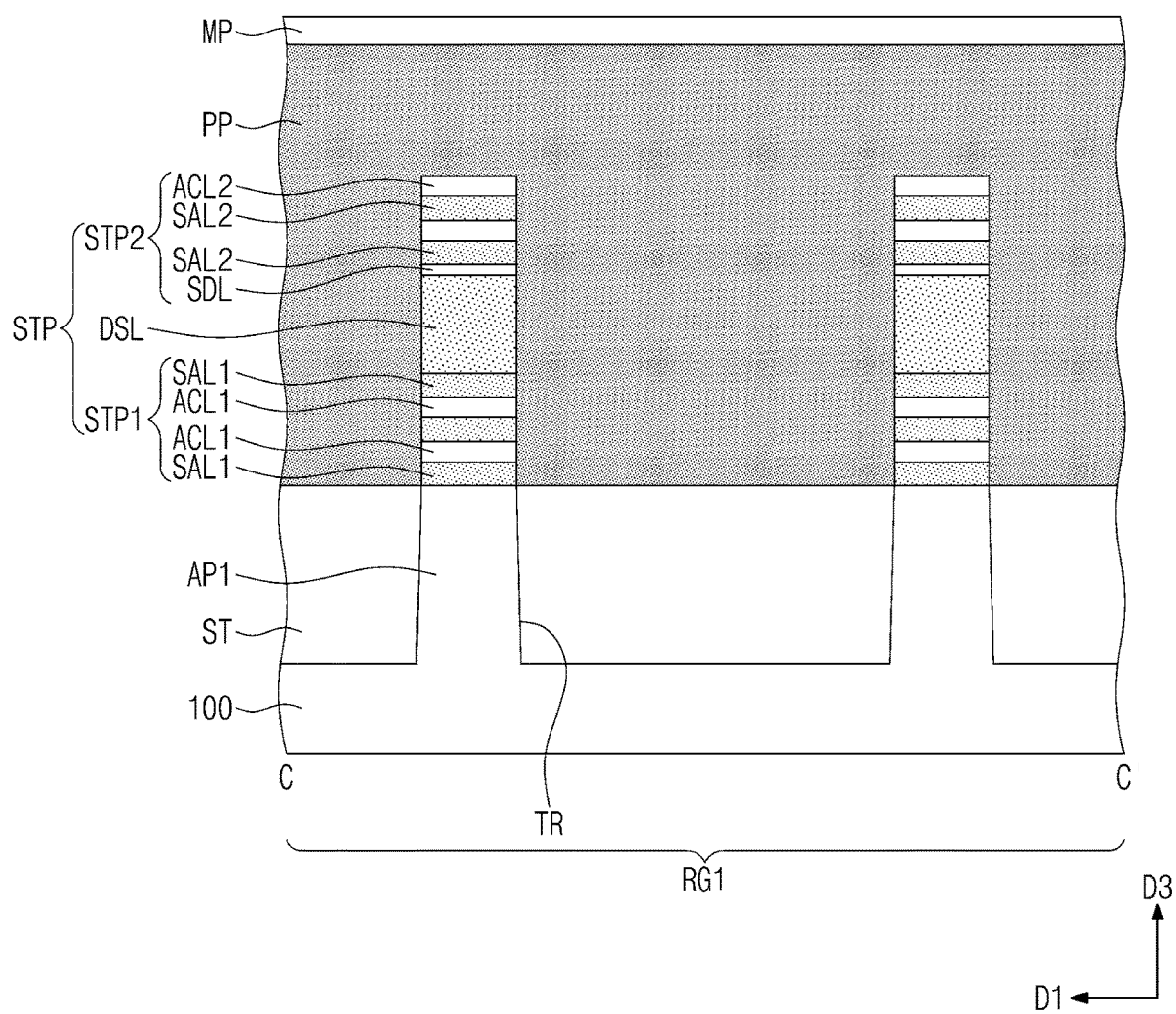
Figure 6C:
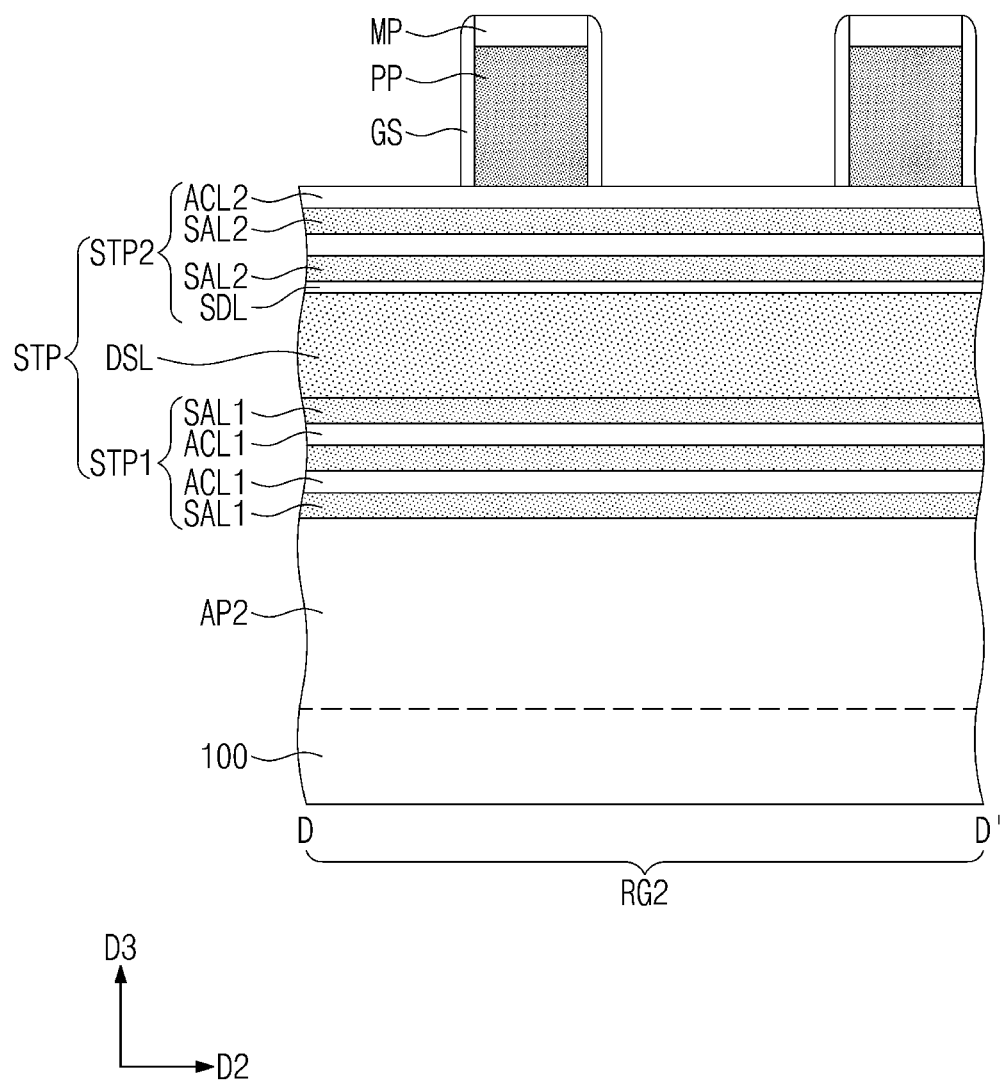

Referring to FIGS. 6A to 6C, a plurality of sacrificial patterns PP may be formed to cross the stacking pattern STP. Each of the sacrificial patterns PP may be formed to have a line shape extended in the first direction D1. In detail, the formation of the sacrificial pattern PP may include forming a sacrificial layer on the substrate 100, forming a hard mask pattern MP on the sacrificial layer, and patterning the sacrificial layer using the hard mask pattern MP as an etch mask. The sacrificial layer may be formed of or include amorphous silicon and/or polysilicon.

The sacrificial pattern PP on the first region RG1 may be formed to have a linewidth that is smaller than a linewidth of the sacrificial pattern PP on the second region RG2. A distance between the sacrificial patterns PP on the first region RG1 may be smaller than a distance between the sacrificial patterns PP on the second region RG2.

A pair of the gate spacers GS may be respectively formed on opposite side surfaces of the sacrificial pattern PP. In detail, a spacer layer may be conformally formed on the substrate 100. The spacer layer may cover the sacrificial pattern PP and the hard mask pattern MP. For example, the spacer layer may be formed of or include at least one of SiCN, SiCON, or SiN. The gate spacers GS may be formed by anisotropically etching the spacer layer.

Figure 7A:
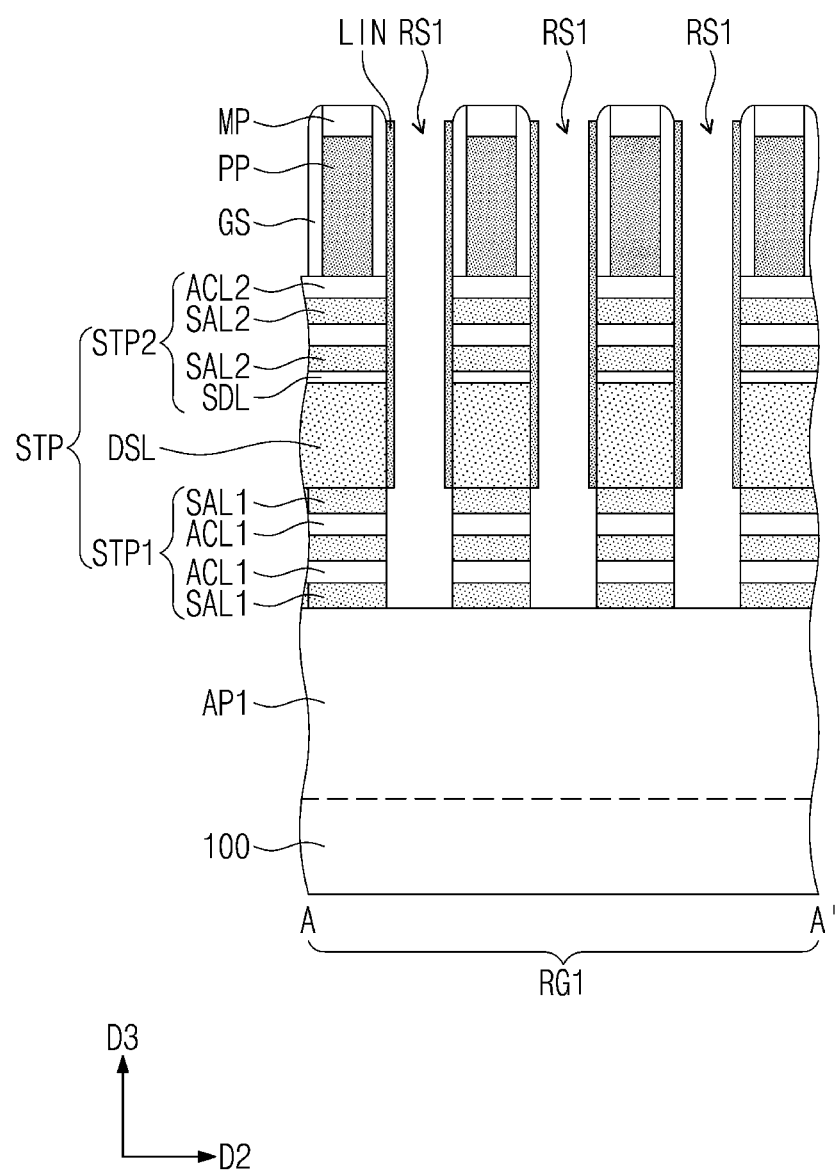
Figure 7B:
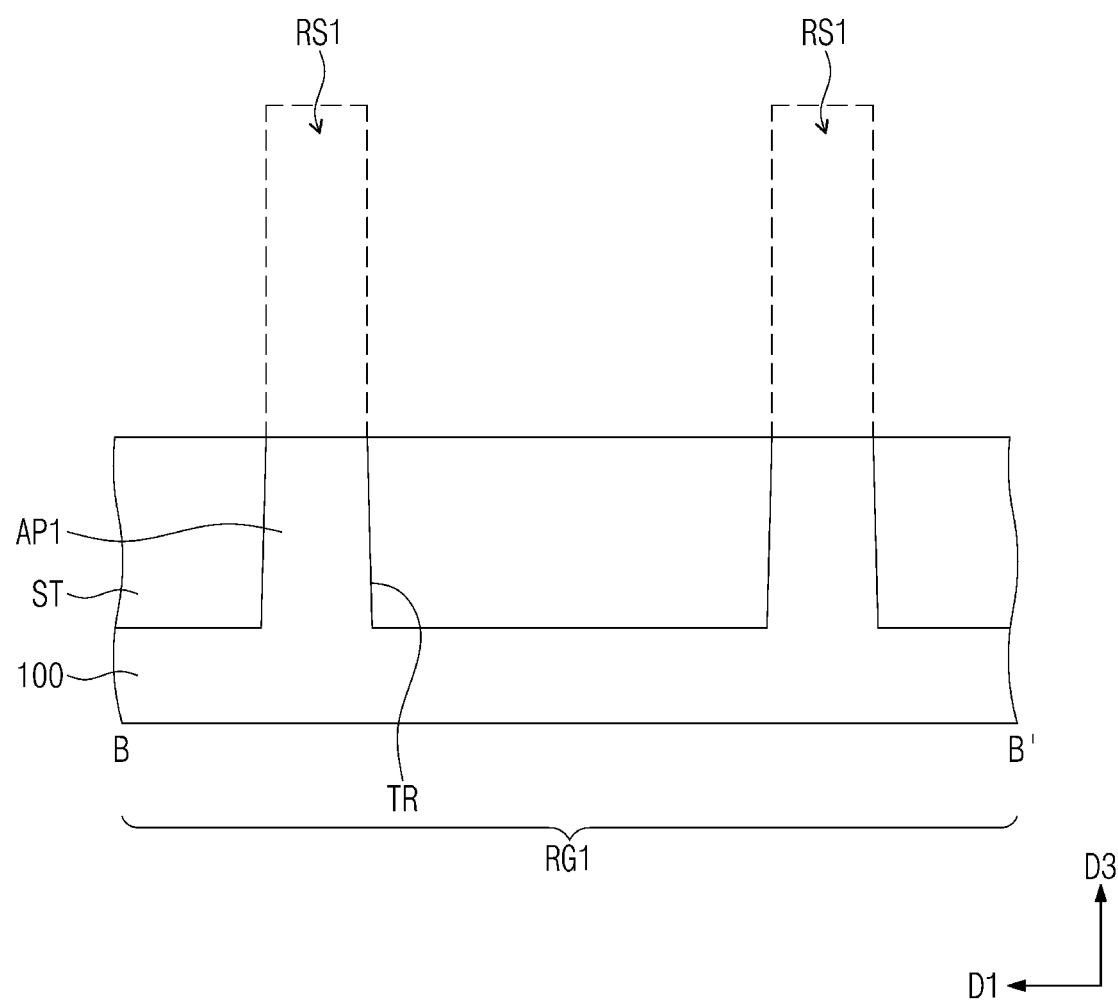
Figure 7C:
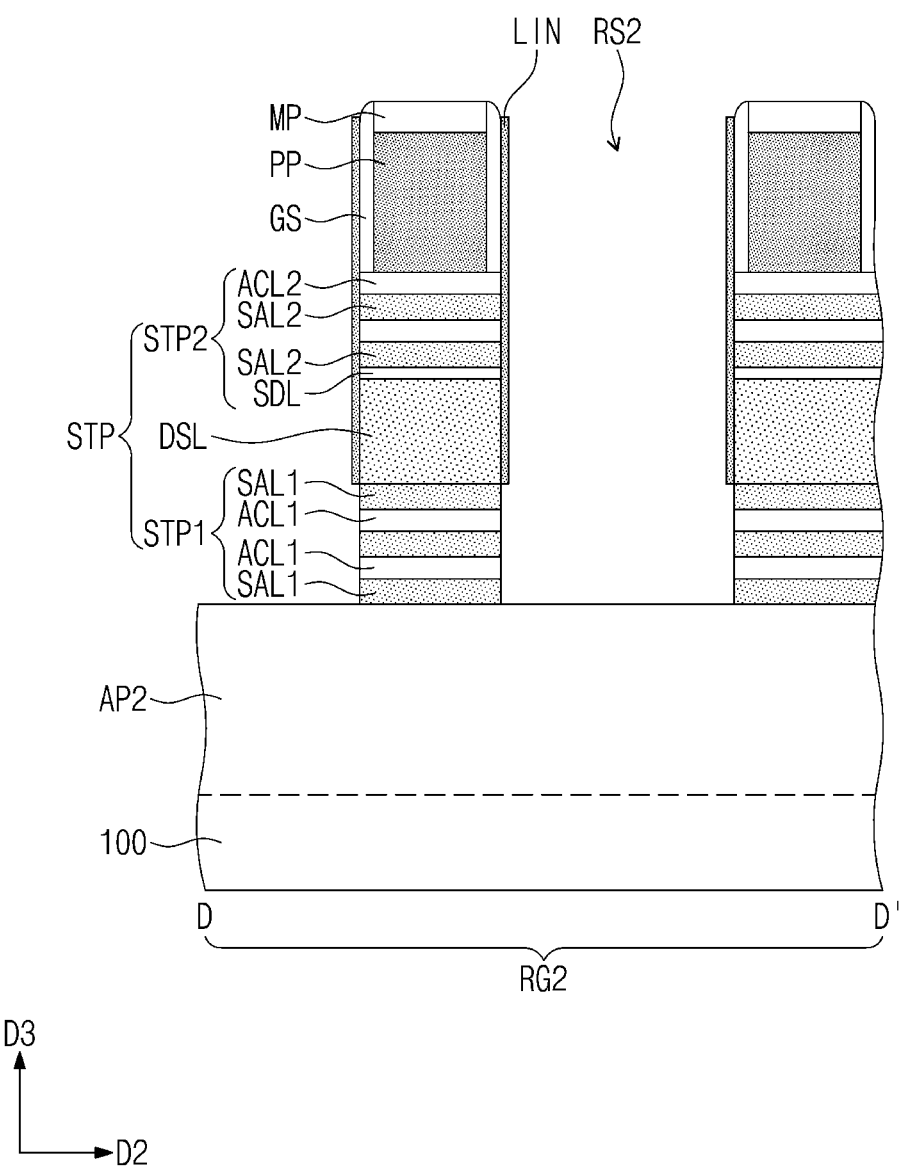

Referring to FIGS. 7A to 7C, an etching process, using the gate spacers GS and the hard mask pattern MP as an etch mask, may be performed on the stacking pattern STP. As a result of the etching process, a first recess RS1 may be formed between the sacrificial patterns PP of the first region RG1. As a result of the etching process, a second recess RS2 may be formed between the sacrificial patterns PP of the second region RG2.

In the case where the separation layer DSL includes silicon germanium (SiGe), the separation layer DSL may be replaced with a silicon-based insulating material. The separation layer DSL, which is exposed by the first and second recesses RS1 and RS2, may be selectively removed to form an empty region, and the empty region may be filled with a silicon-based insulating material (e.g., silicon nitride).

Liner layers LIN may be respectively formed on opposite side surfaces of the upper stacking pattern STP2. The liner layers LIN may prevent the upper stacking pattern STP2 from being exposed to the recesses RS1 and RS2. The liner layers LIN may also cover the separation layer DSL. However, the liner layers LIN may be formed to expose the lower stacking pattern STP1. In an example embodiment, the liner layers LIN may be formed of or include silicon nitride.

Figure 8A:
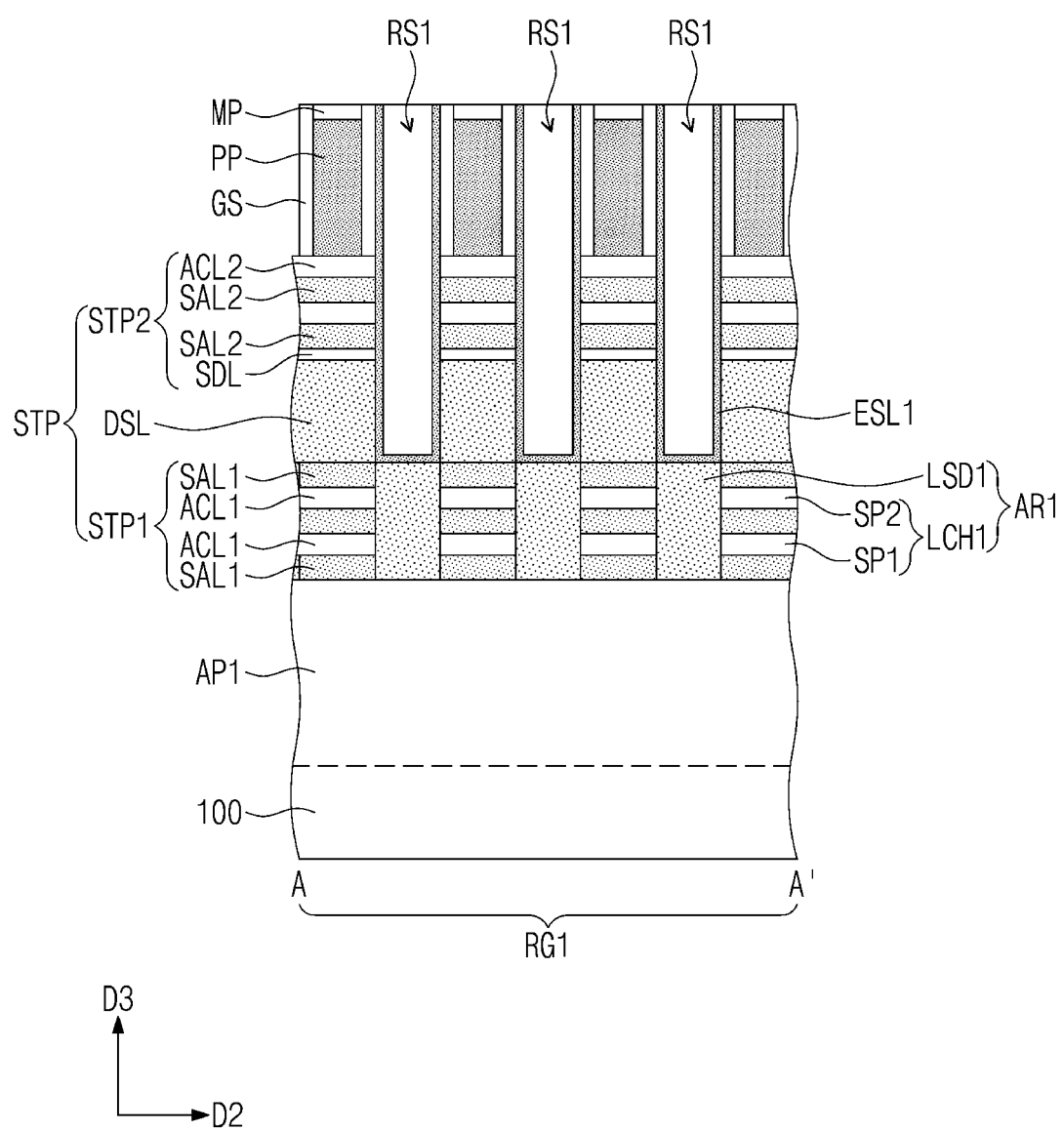
Figure 8B:
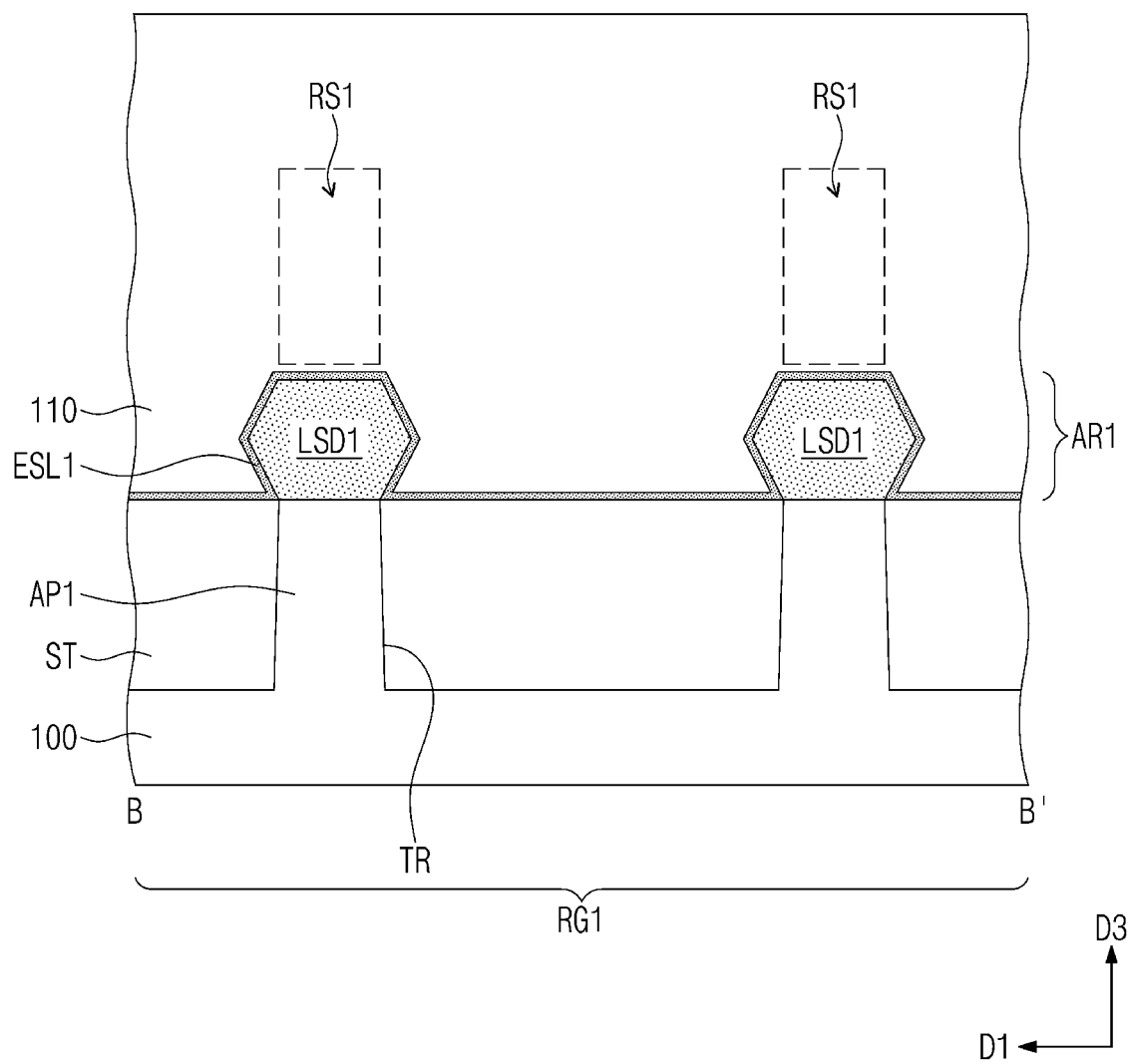
Figure 8C:
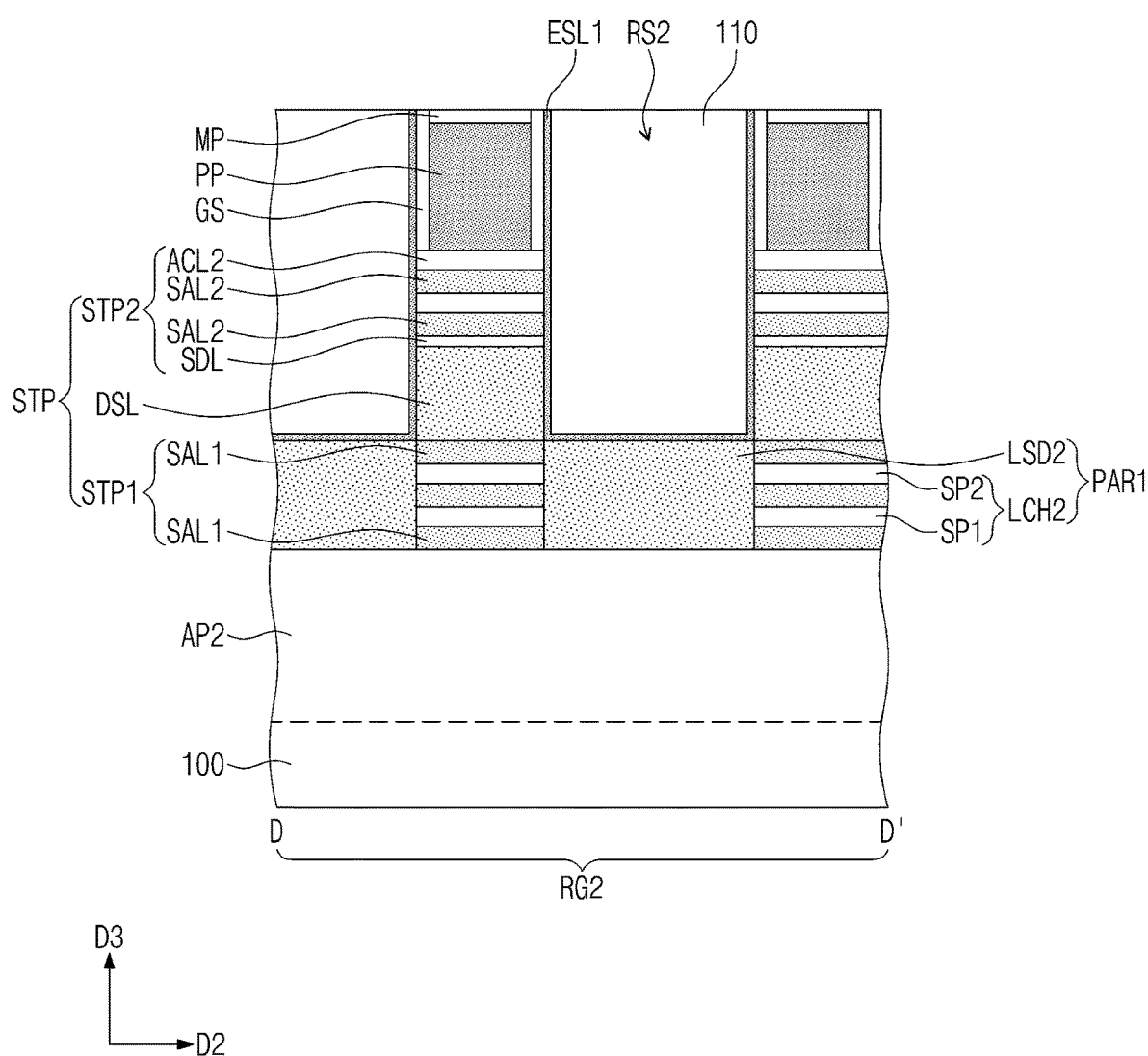

Referring to FIGS. 8A to 8C, the first lower source/drain patterns LSD1 may be formed in the first recesses RS1, respectively. In detail, the first lower source/drain pattern LSD1 may be formed by performing a SEG process using the exposed side surface of the lower stacking pattern STP1 and the exposed top surface of the first active pattern AP1 as a seed layer. The first lower source/drain pattern LSD1 may be grown using the first active layers ACL1 and the first active pattern AP1, which are exposed by the first recess RS1, as a seed. In an example embodiment, the SEG process may include a chemical vapor deposition (CVD) process or a molecular beam epitaxy (MBE) process.

During the SEG process, impurities may be injected into the first lower source/drain pattern LSD1 in an in-situ manner. In an example embodiment, impurities may be injected into the first lower source/drain pattern LSD1, after the formation of the first lower source/drain pattern LSD1. The first lower source/drain pattern LSD1 may be doped to have a first conductivity type (e.g., n-type).

The side surface of the upper stacking pattern STP2 may be covered with the liner layer LIN. That is, due to the liner layer LIN, the second active layers ACL2 of the upper stacking pattern STP2 may not be exposed to the outside during the SEG process. Thus, an additional semiconductor layer may not be grown on the upper stacking pattern STP2 during the SEG process.

The first active layers ACL1, which are interposed between a pair of the first lower source/drain patterns LSD1, may constitute the first lower channel pattern LCH1. In this regard, the first and second semiconductor patterns SP1 and SP2 of the first lower channel pattern LCH1 may be formed from the first active layers ACL1. The first lower channel patterns LCH1 and the first lower source/drain patterns LSD1 may constitute the first active region AR1, which is a bottom tier of a three-dimensional device.

The second lower source/drain patterns LSD2 may be formed in the second recesses RS2, respectively. In detail, the second lower source/drain pattern LSD2 may be formed by performing a SEG process using the exposed side surface of the lower stacking pattern STP1 and the exposed top surface of the second active pattern AP2 as a seed layer. In an example embodiment, the second lower source/drain pattern LSD2 may be formed simultaneously with the first lower source/drain pattern LSD1 described above.

Because the second lower source/drain pattern LSD2 is grown using not only the first active layers ACL1 but also the second active pattern AP2 as the seed layer, the second lower source/drain pattern LSD2 may be formed to fully fill a space between the stacking patterns STP of the second region RG2.

The first active layers ACL1, which are interposed between a pair of the second lower source/drain patterns LSD2, may constitute the second lower channel pattern LCH2. That is, the first and second semiconductor patterns SP1 and SP2 of the second lower channel pattern LCH2 may be formed from the first active layers ACL1. The second lower channel patterns LCH2 and the second lower source/drain patterns LSD2 may constitute the first peripheral active region PAR1, which is the bottom tier of the three-dimensional device.

The liner layer LIN may be selectively removed, and then, the first etch stop layer ESL1 may be conformally formed in the first and second recesses RS1 and RS2. The first etch stop layer ESL1 may cover the first and second lower source/drain patterns LSD1 and LSD2. The first interlayer insulating layer 110 may be formed in the first and second recesses RS1 and RS2.

Figure 9A:
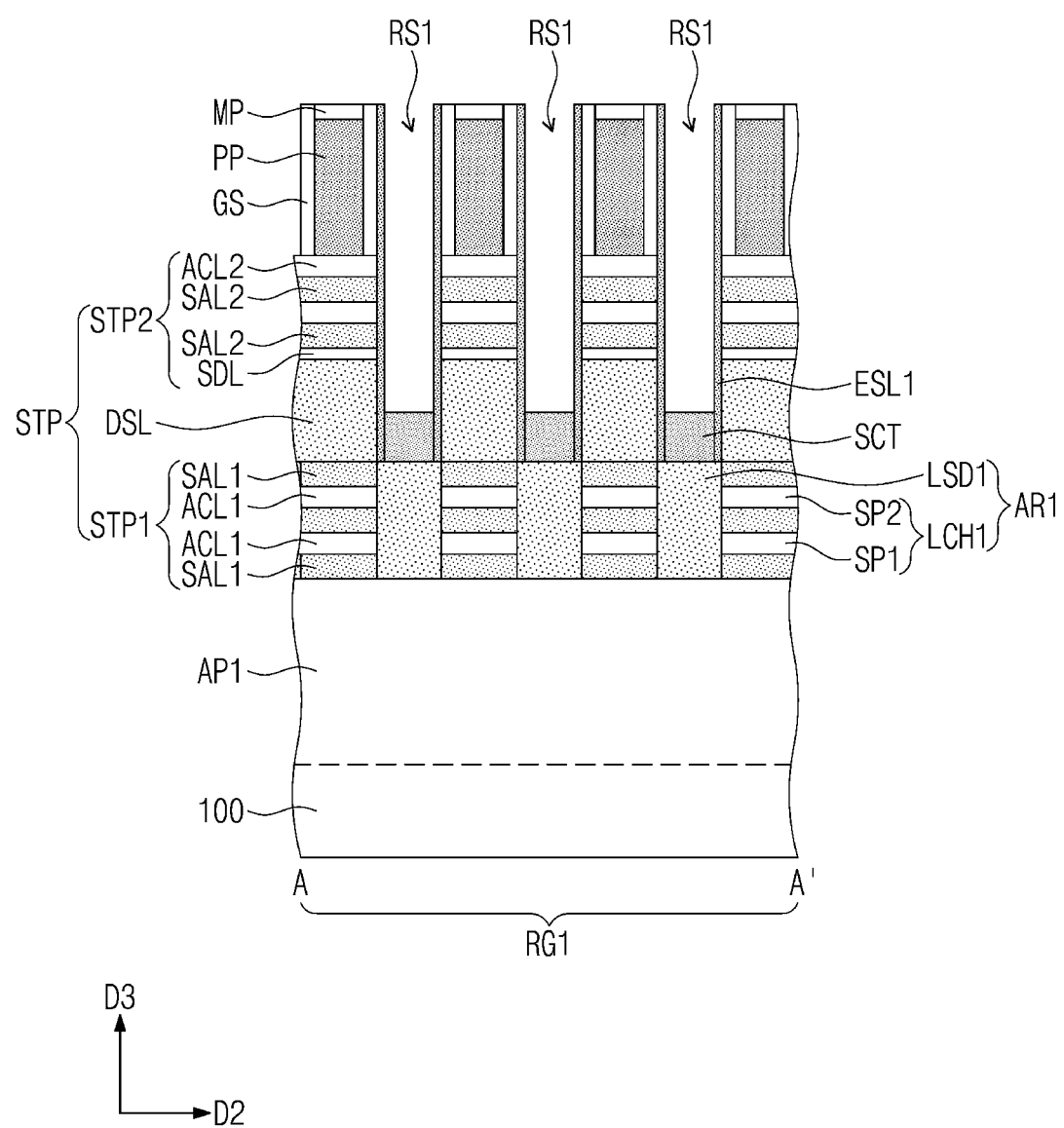
Figure 9B:
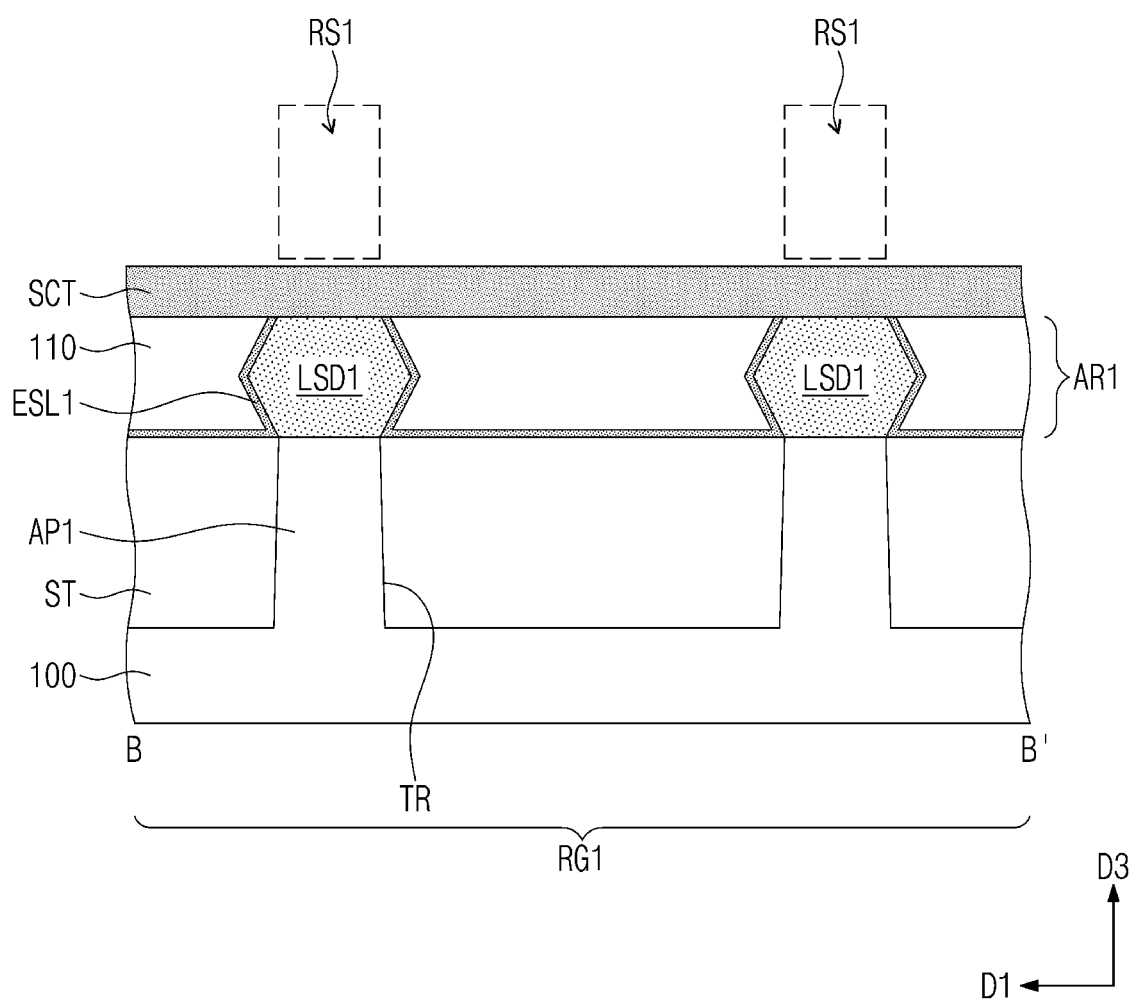
Figure 9C:
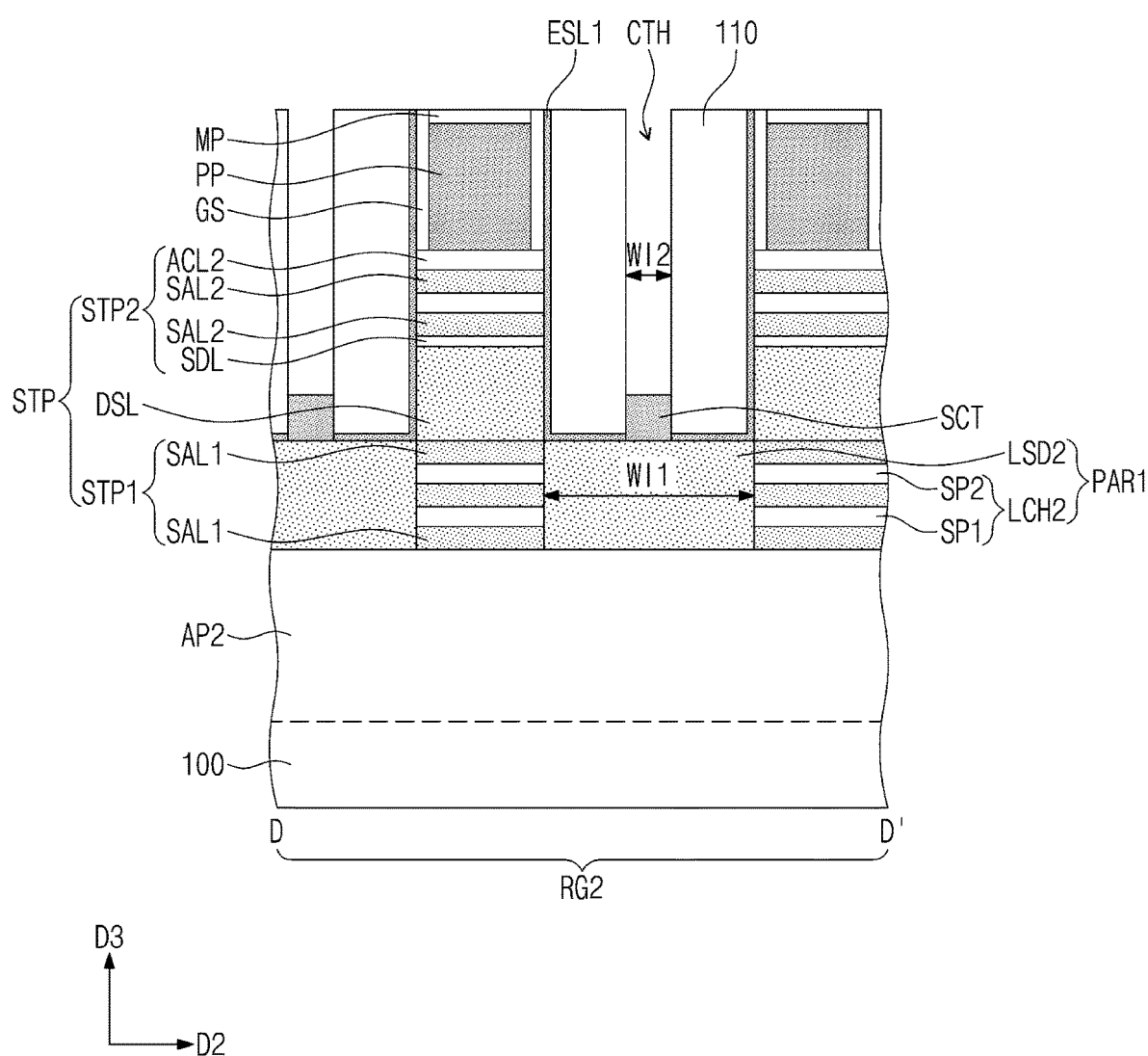

Referring to FIGS. 9A to 9C, the first interlayer insulating layer 110 in the first recess RS1 may be selectively etched. The first interlayer insulating layer 110 may be etched until the top surfaces of the first lower source/drain patterns LSD1 are exposed.

A lower sacrificial layer SCT may be formed on the exposed top surfaces of the first lower source/drain patterns LSD1. The lower sacrificial layer SCT may include line-shaped patterns, which are extended in the first direction D1 (e.g., see FIG. 9B). The lower sacrificial layer SCT may be formed of or include silicon germanium (SiGe). The lower sacrificial layer SCT may be formed to have a germanium concentration ranging from 40 at % to 90 at %.

The first interlayer insulating layer 110 in the second recess RS2 may be patterned to form a contact hole CTH. In detail, mask patterns may be formed on the first interlayer insulating layer 110 in the second recess RS2. The mask patterns may be formed using a photolithography process. The contact hole CTH may be formed by anisotropically etching the first interlayer insulating layer 110 using the mask patterns as an etch mask. The contact hole CTH may be formed to partially exposed top surfaces of the second lower source/drain patterns LSD2.

In an example embodiment, the contact hole CTH may be formed to have a width WI2 that is smaller than a width WI1 of the second lower source/drain pattern LSD2. For example, a ratio (WI2/WI1) of the width WI2 of the contact hole CTH to the width WI1 of the second lower source/drain pattern LSD2 may be 0.1 to 0.5.

The lower sacrificial layer SCT may be formed in a lower portion of the contact hole CTH. The lower sacrificial layer SCT may be formed to have substantially the same features as the lower sacrificial layer SCT in the first recess RS1 described above.

Figure 10A:
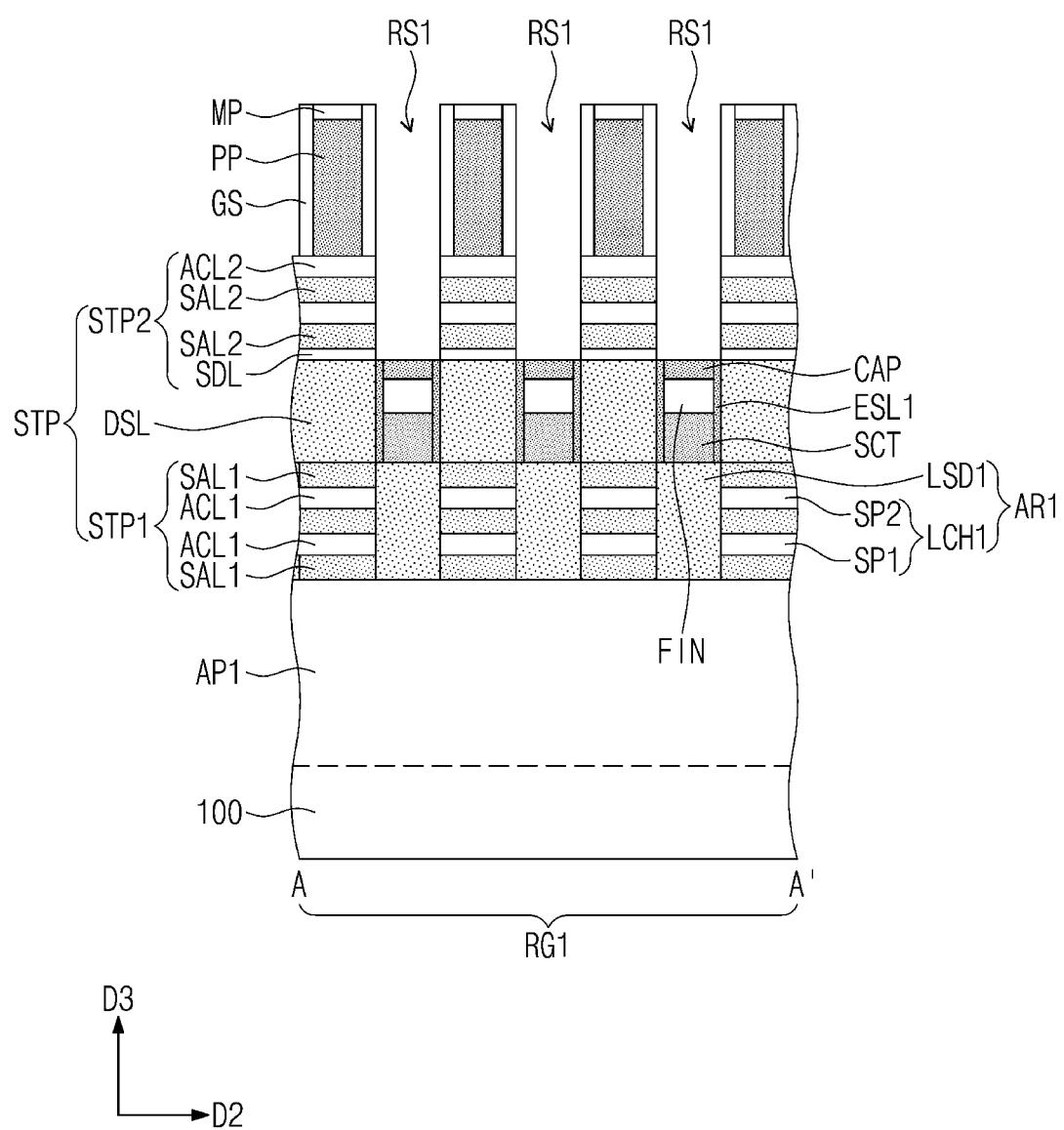
Figure 10B:
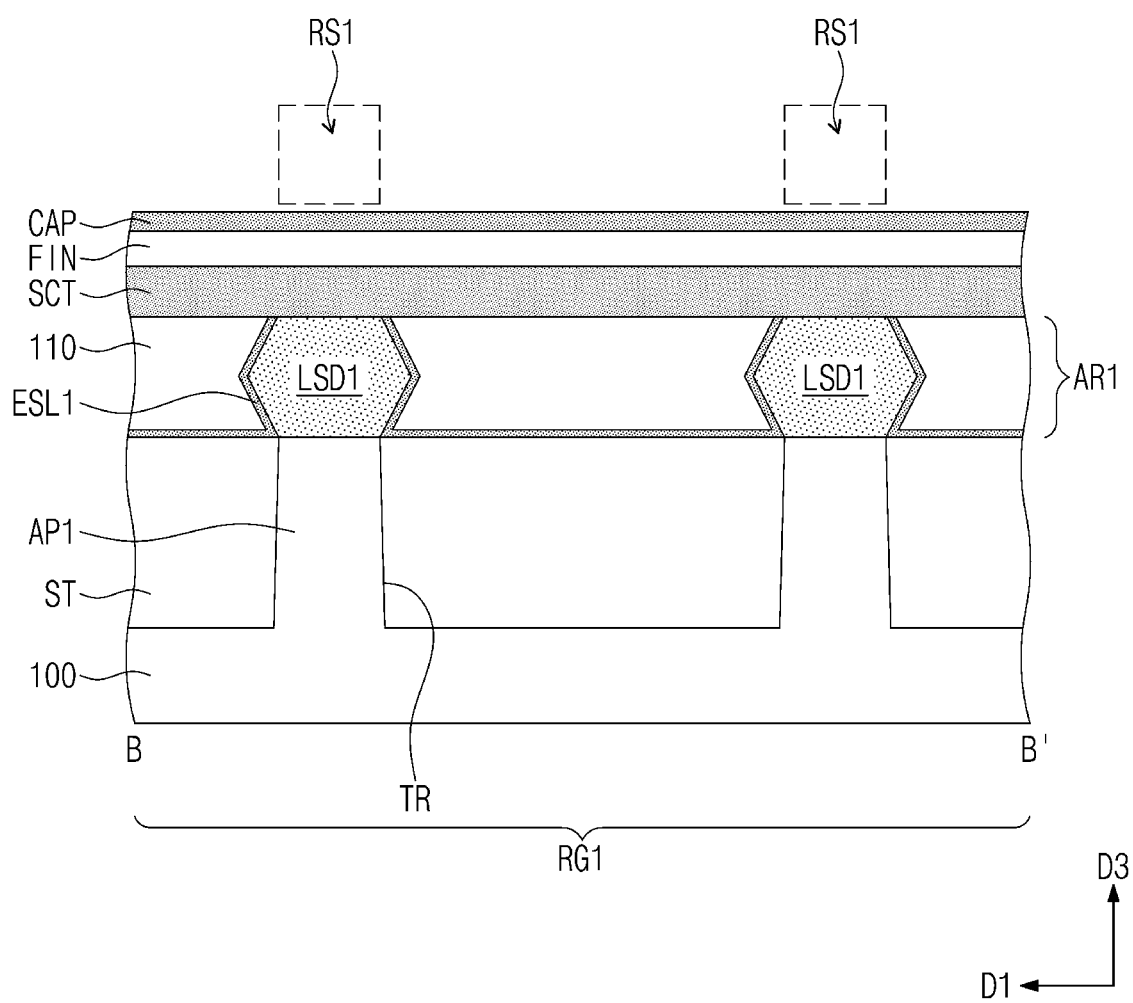
Figure 10C:
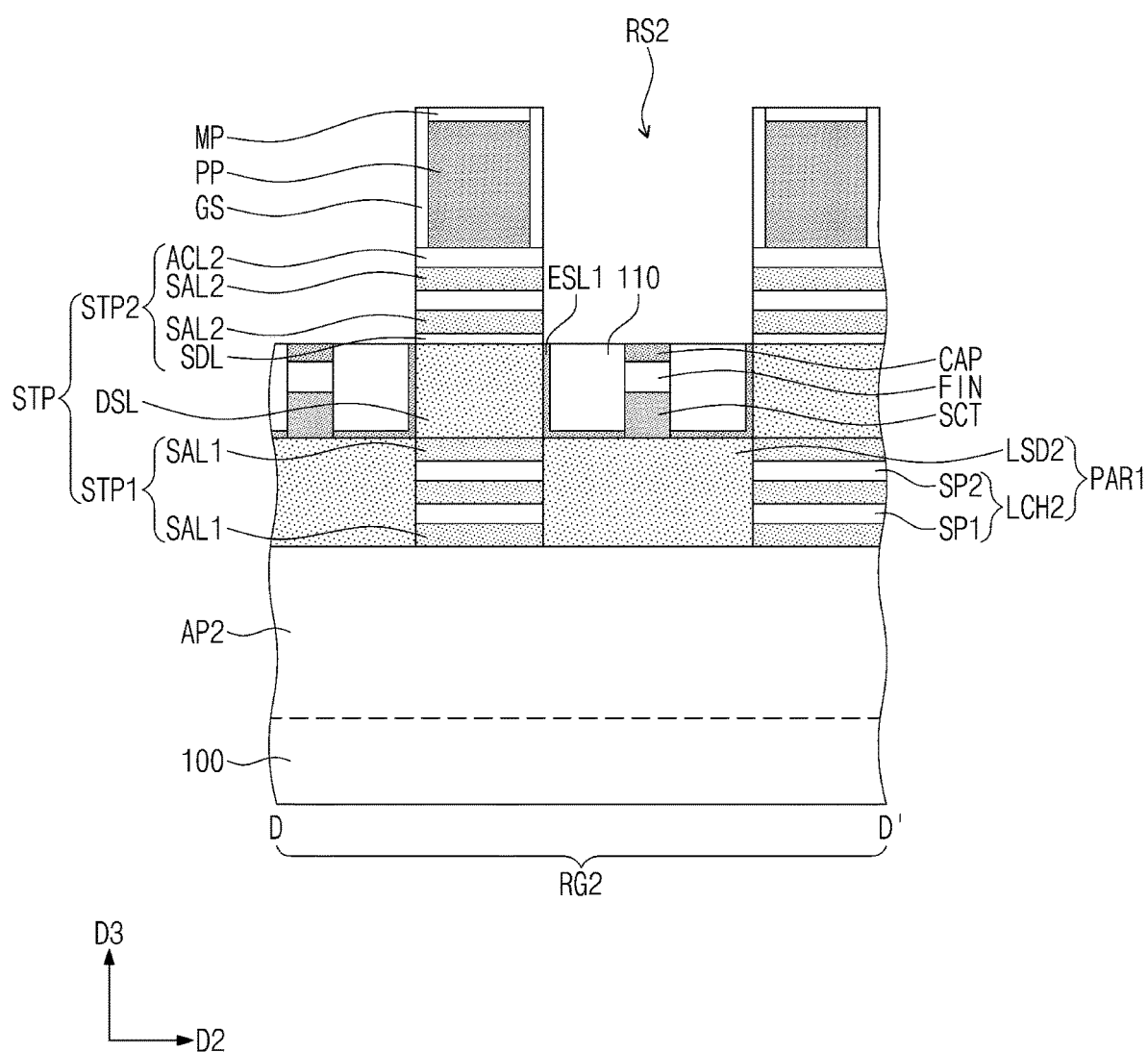

Referring to FIGS. 10A to 10C, the gapfill insulating layer FIN may be formed on the lower sacrificial layer SCT. The gapfill insulating layer FIN may be formed of the same material as the first interlayer insulating layer 110. The capping pattern CAP may be formed on the gapfill insulating layer FIN. The first interlayer insulating layer 110 and the first etch stop layer ESL1 may be recessed to expose the upper stacking pattern STP2.

Figure 11A:
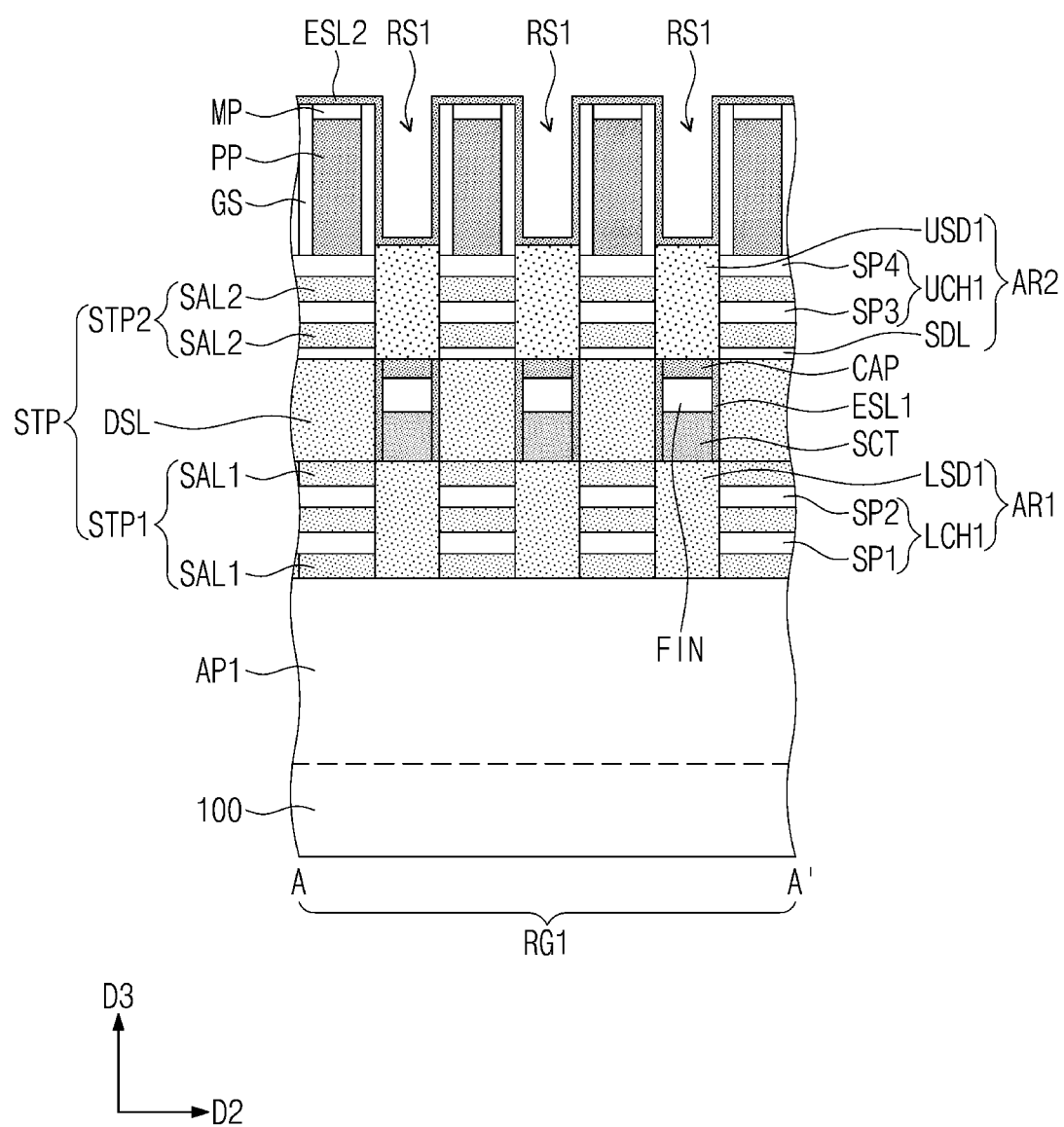
Figure 11B:
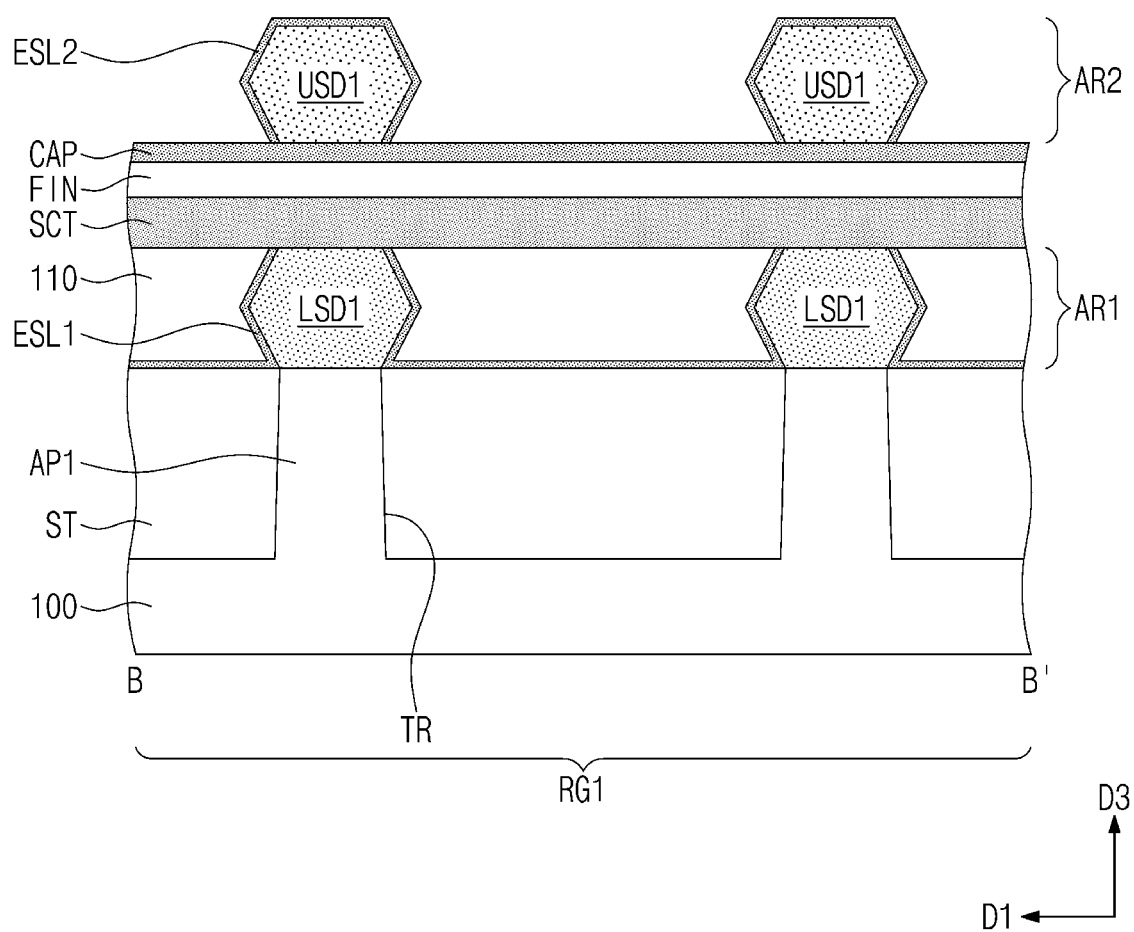
Figure 11C:
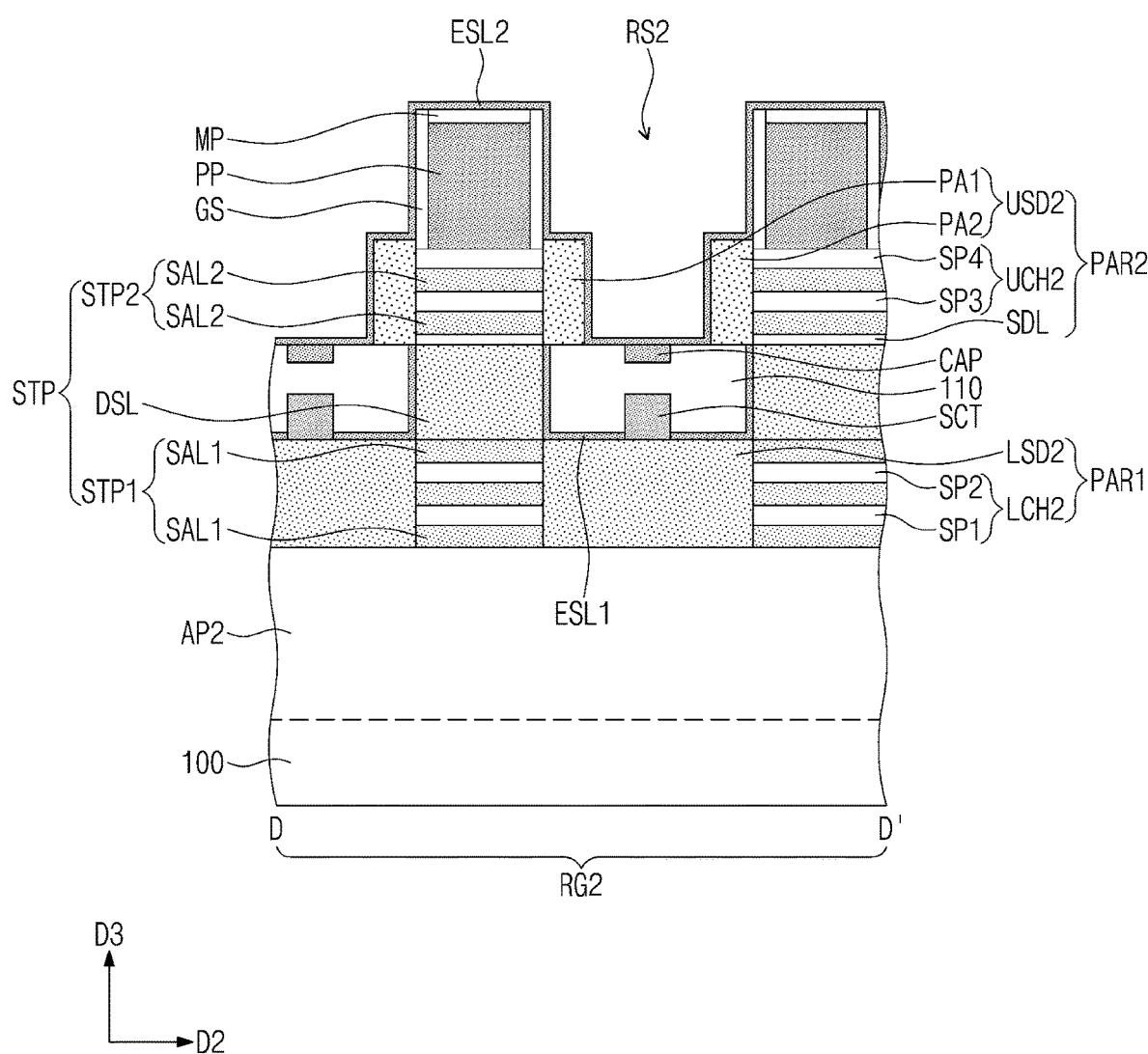

Referring to FIGS. 11A to 11C, the first upper source/drain pattern USD1 may be formed between the upper stacking patterns STP2 on the first region RG1. In detail, a SEG process using a side surface of the upper stacking pattern STP2 as a seed layer may be performed to form the first upper source/drain pattern USD1. The first upper source/drain pattern USD1 may be formed using the second active layers ACL2 and the seed layer SDL, which are exposed by the first recess RS1, as a seed. The first upper source/drain pattern USD1 may be doped to have a second conductivity type (e.g., p-type) that is different from the first conductivity type.

The second active layers ACL2, which are interposed between a pair of the first upper source/drain patterns USD1, may constitute the first upper channel pattern UCH1. In this regard, the third and fourth semiconductor patterns SP3 and SP4 of the first upper channel pattern UCH1 may be formed from the second active layers ACL2. The first upper channel patterns UCH1 and the first upper source/drain patterns USD1 may constitute the second active region AR2, which is a top tier of the three-dimensional device.

The second upper source/drain pattern USD2 may be formed between the upper stacking patterns STP2 on the second region RG2. The second upper source/drain pattern USD2 of the second region RG2 may be formed simultaneously with the first upper source/drain pattern USD1 of the first region RG1 described above.

The second active layers ACL2, which are interposed between a pair of the second upper source/drain patterns USD2, may constitute the second upper channel pattern UCH2. That is, the third and fourth semiconductor patterns SP3 and SP4 of the second upper channel pattern UCH2 may be formed from the second active layers ACL2. The second upper channel patterns UCH2 and the second upper source/drain patterns USD2 may constitute the second peripheral active region PAR2, which is the top tier of the three-dimensional device.

The formation of the second upper source/drain pattern USD2 may include forming the first and second sub-patterns PA1 and PA2 on side surfaces of the upper stacking patterns STP2, respectively. The first and second sub-patterns PA1 and PA2 may be spaced apart from each other in the second direction D2. This is because, due to a relatively large distance between the upper stacking patterns STP2 on the second region RG2, the first and second sub-patterns PA1 and PA2 are not merged into a single pattern. The second etch stop layer ESL2 may be conformally formed on the first and second upper source/drain patterns USD1 and USD2.

Figure 12A:
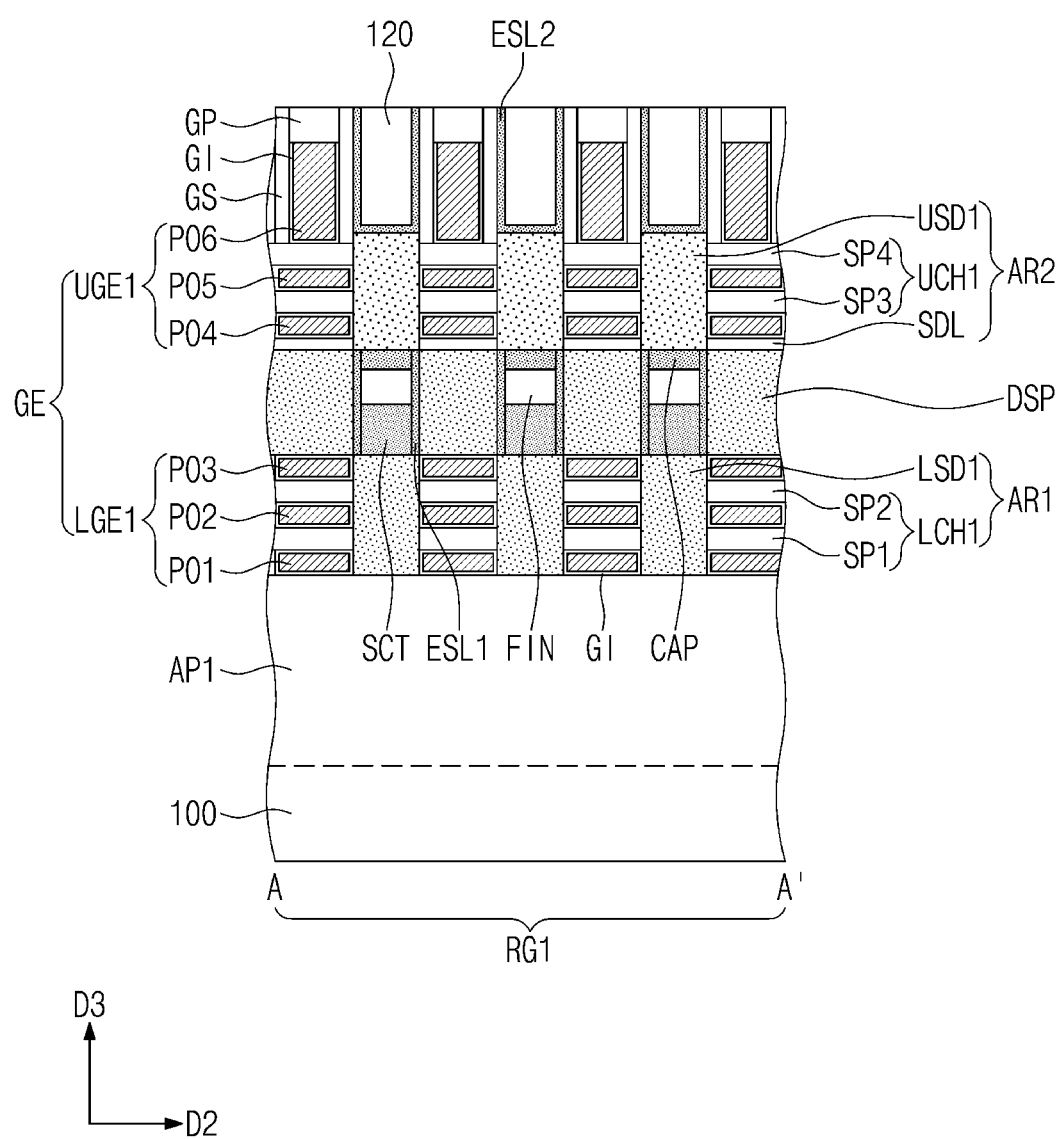
Figure 12B:
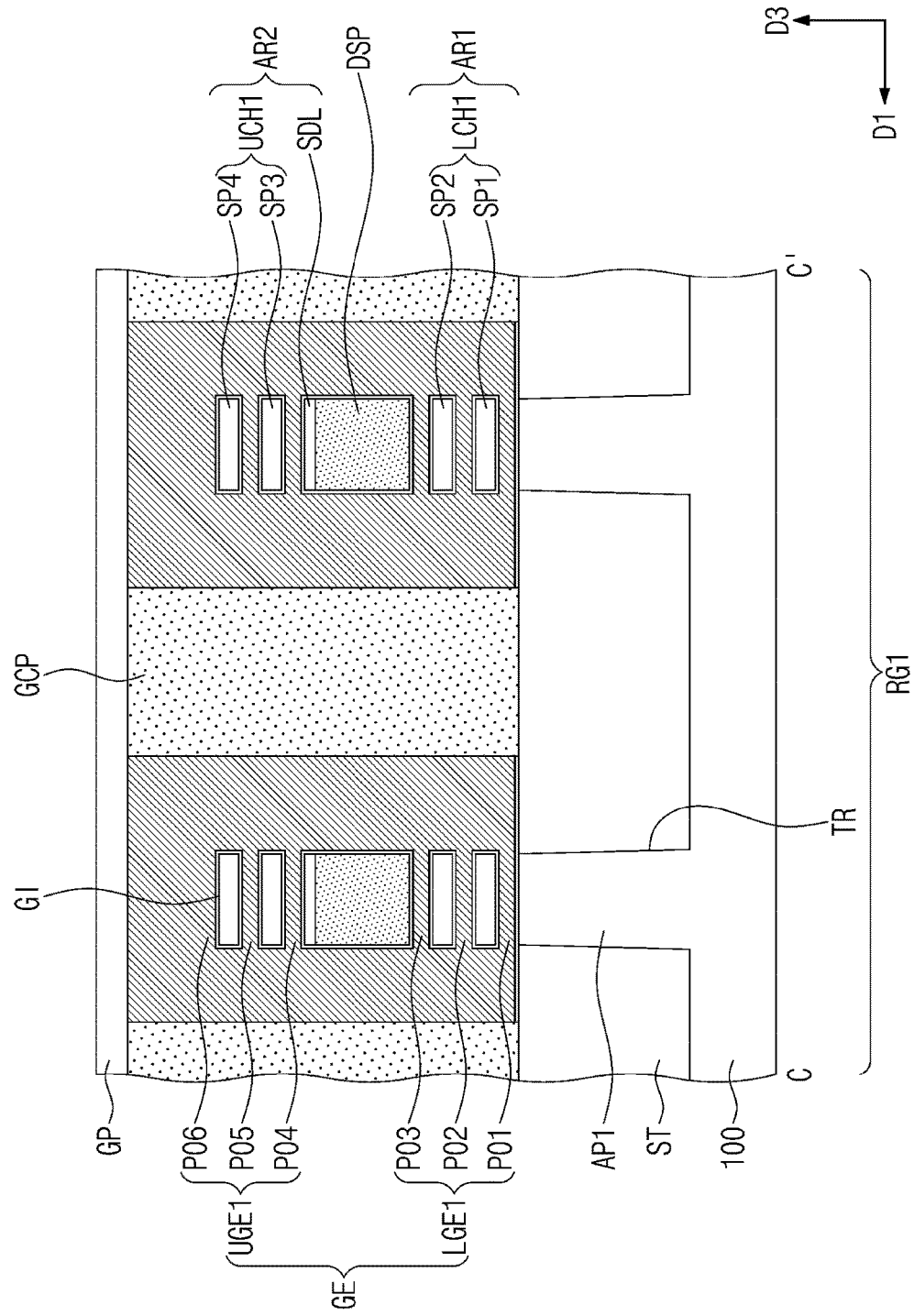
Figure 12C:
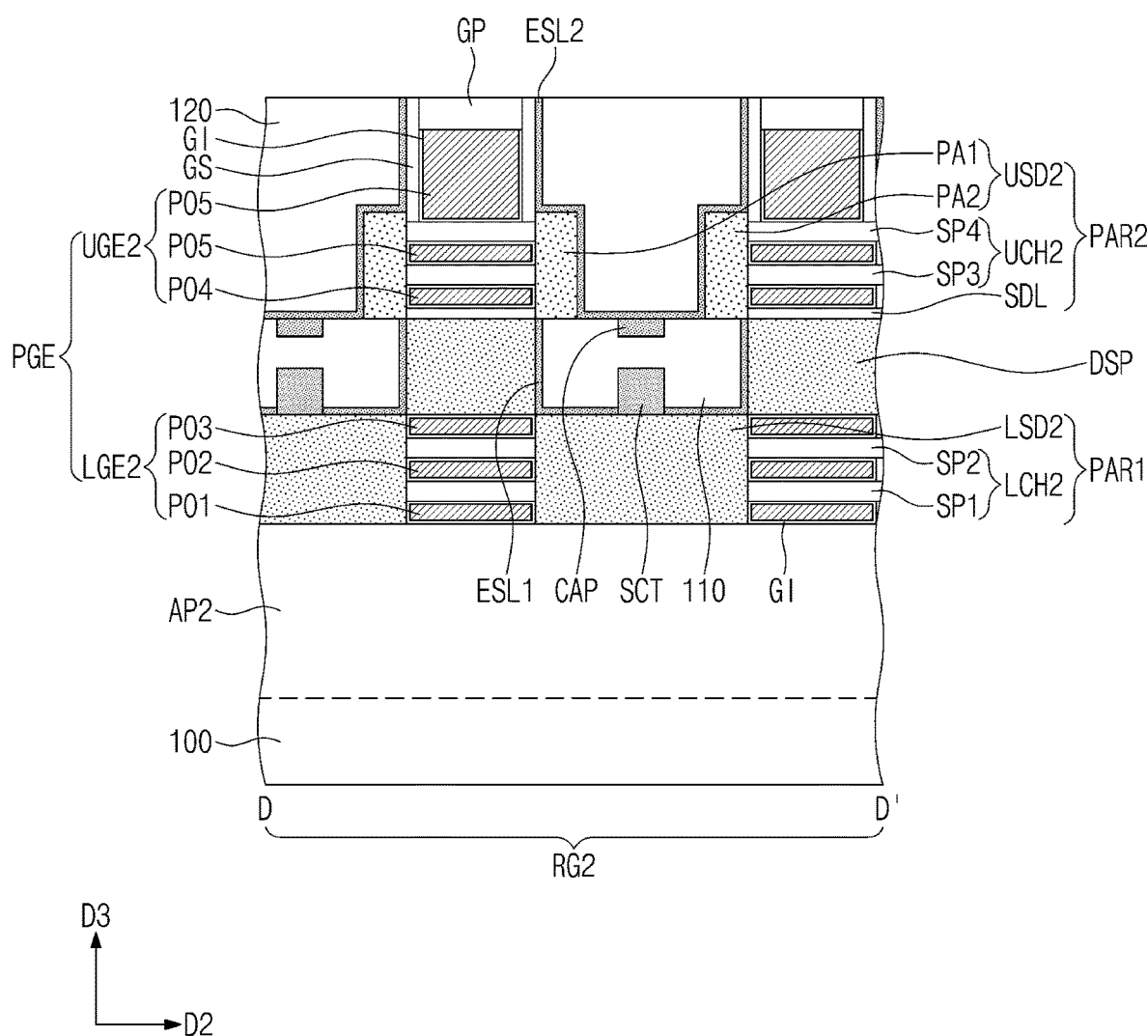

Referring to FIGS. 12A to 12C, the second interlayer insulating layer 120 may be formed on the second etch stop layer ESL2. As an example, the second interlayer insulating layer 120 may include a silicon oxide layer.

The second interlayer insulating layer 120 may be planarized to expose a top surface of the sacrificial pattern PP. The planarization of the second interlayer insulating layer 120 may be performed using an etch-back process or a chemical mechanical polishing (CMP) process. All of the hard mask pattern MP may be removed during the planarization process. As a result, a top surface of the second interlayer insulating layer 120 may be coplanar with the top surface of the sacrificial pattern PP and top surfaces of the gate spacers GS.

The gate cutting pattern GCP may be formed to penetrate the sacrificial pattern PP. The gate cutting pattern GCP may be formed of or include at least one of a silicon oxide layer and/or a silicon nitride layer.

The exposed sacrificial pattern PP may be selectively removed. The removal of the sacrificial pattern PP may include a wet etching process using etching solution capable of selectively etching polysilicon. As a result of the removal of the sacrificial pattern PP, the first and second sacrificial layers SAL1 and SAL2 may be exposed.

An etching process, which is chosen to selectively etch the first and second sacrificial layers SAL1 and SAL2, may be performed to leave the first to fourth semiconductor patterns SP1-SP4 and the dummy channel pattern DSP and to remove only the first and second sacrificial layers SAL1 and SAL2. An etchant used in the etching process may be chosen to have a high etch rate to silicon germanium. For example, the etching process may be performed to etch a silicon germanium layer, in which germanium concentration is higher than 10 at %, at a high etch rate.

The gate insulating layer GI may be conformally formed in spaces, which are formed by removing the sacrificial pattern PP and the first and second sacrificial layers SAL1 and SAL2. The gate electrode GE may be formed on the gate insulating layer GI of the first region RG1. The formation of the gate electrode GE may include forming the first to fifth portions PO1-PO5 between the first to fourth semiconductor patterns SP1-SP4 and forming the sixth portion PO6 in a space, from which the sacrificial pattern PP is removed.

The gate electrode GE may be vertically recessed to have a reduced height. The gate capping pattern GP may be formed on the recessed gate electrode GE. A planarization process may be performed on the gate capping pattern GP such that a top surface of the gate capping pattern GP is coplanar with a top surface of the second interlayer insulating layer 120.

The peripheral gate electrode PGE may be formed on the second region RG2. The formation of the peripheral gate electrode PGE may be substantially the same as the formation of the gate electrode GE.

Figure 13A:
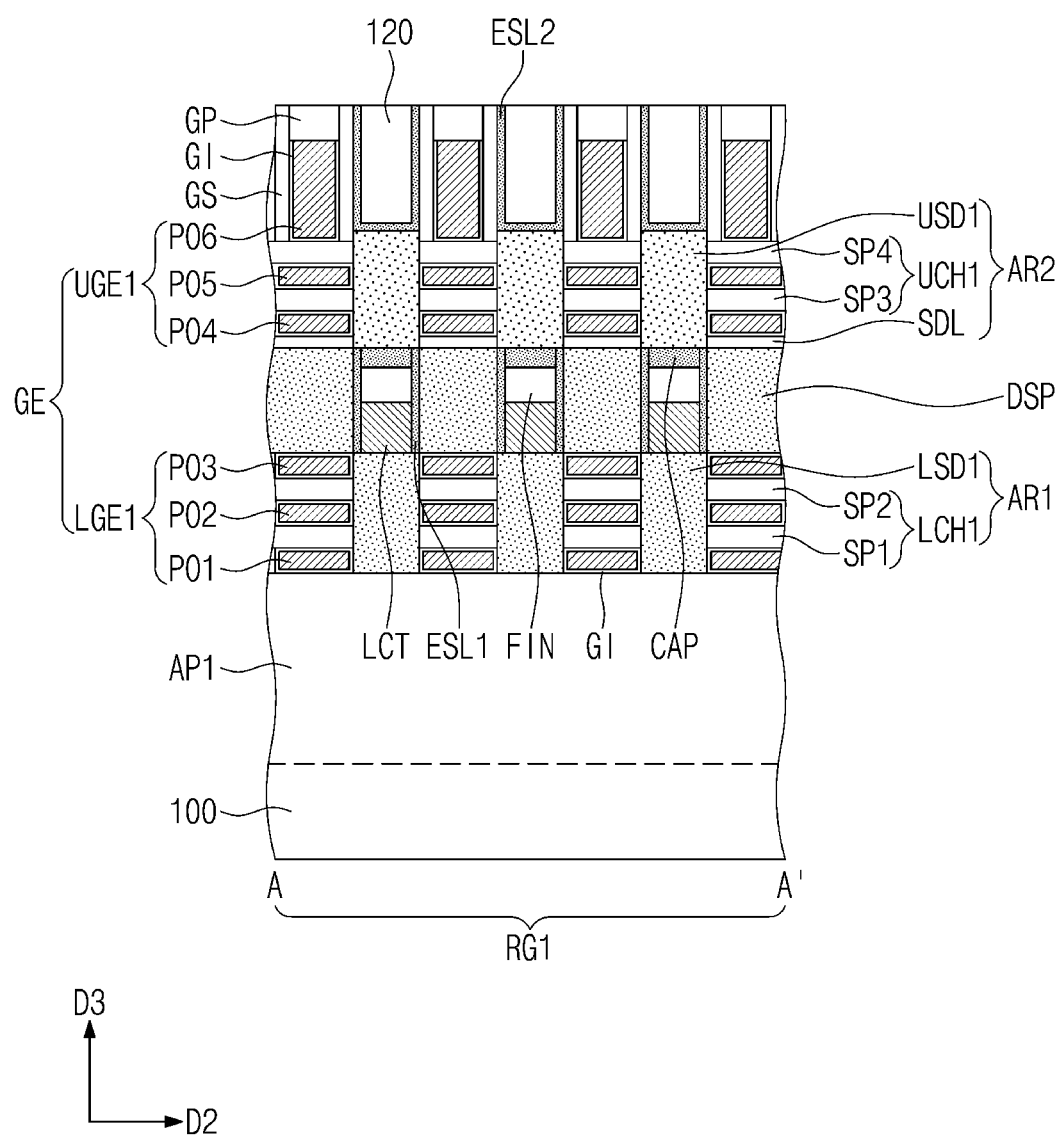
Figure 13B:
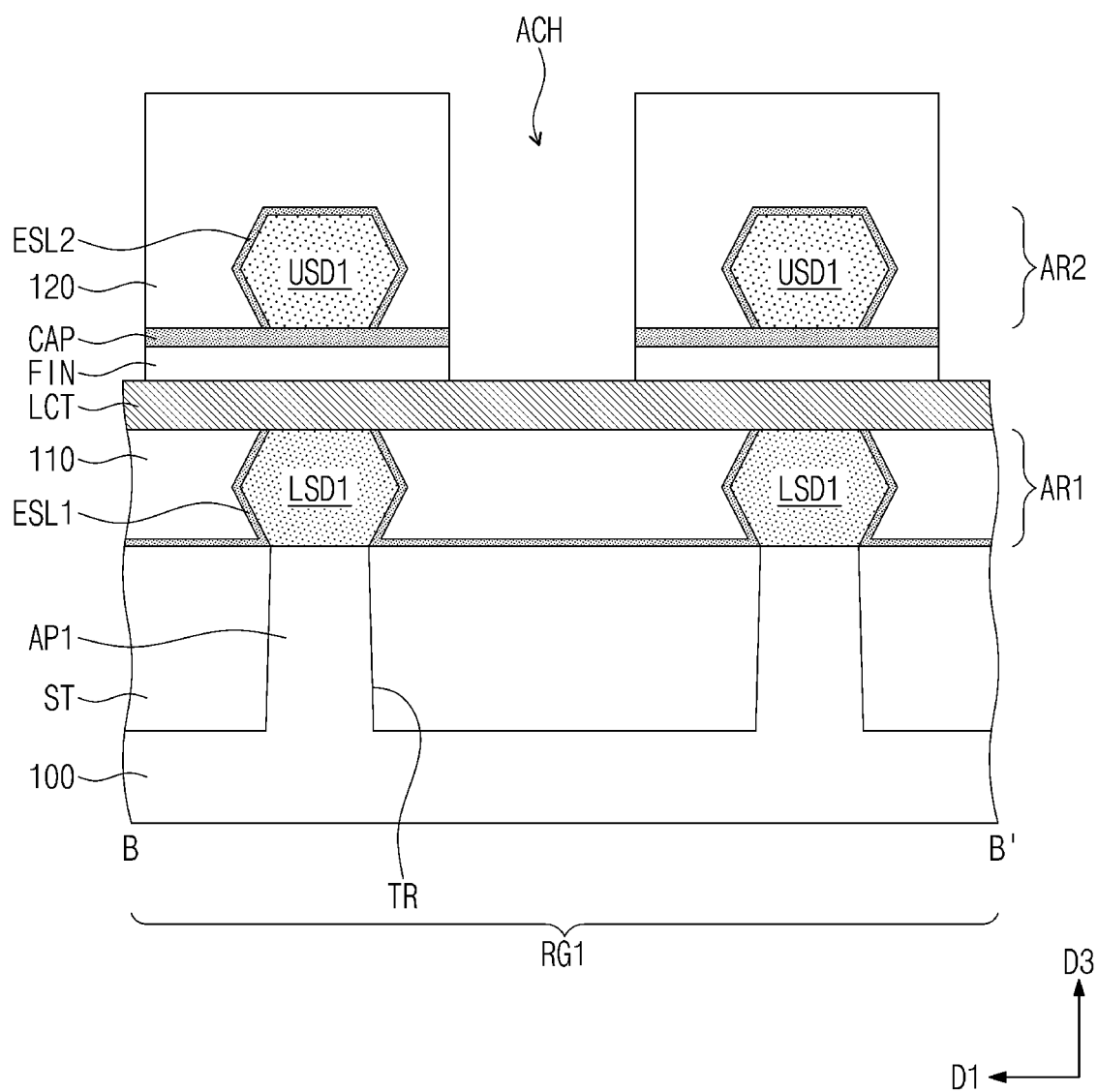
Figure 13C:
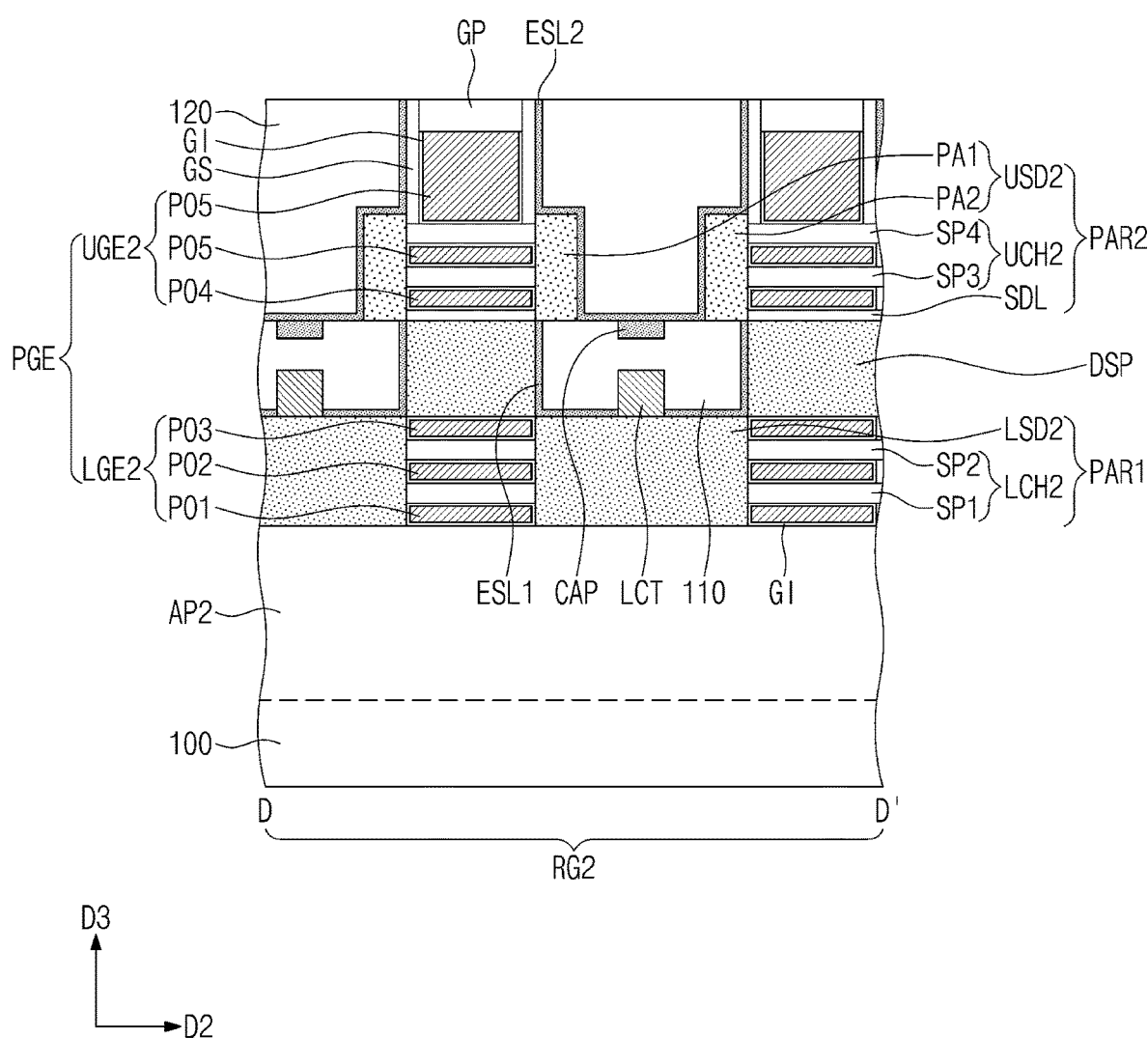

Referring to FIGS. 13A to 13C, the lower sacrificial layer SCT may be replaced with the lower contact LCT. In detail, an access hole ACH may be formed between adjacent ones of the first active patterns AP1 (e.g., see FIG. 13B). The access hole ACH may be formed between adjacent ones of the second active patterns AP2. The access hole ACH may be formed to expose the lower sacrificial layer SCT.

The lower sacrificial layer SCT may be selectively removed through the access hole ACH. The lower contact LCT may be formed by filling a region, which is formed by removing the lower sacrificial layer SCT, with a metallic material that is supplied through the access hole ACH. The metallic material filling the access hole ACH may be recessed to leave only the lower contact LCT.

Referring back to FIGS. 3 and 4A to 4E, an insulating layer may be formed to fill the access hole ACH. The contact cutting pattern CCP may be formed to divide the lower contact LCT into a plurality of lower contacts LCT.

The first active contact AC1 may be formed to be coupled to each of the lower contacts LCT. The second active contact AC2 may be formed to be coupled to each of the first upper source/drain patterns USD1. The second active contact AC2 on the second region RG2 may include the first contact AC2_a and the second contact AC2_b, which are respectively coupled to the first sub-pattern PA1 and the second sub-pattern PA2. The gate contacts GC may be formed to be coupled to the gate electrode GE and the peripheral gate electrode PGE, respectively.

The third interlayer insulating layer 130 may be formed on the second interlayer insulating layer 120. The first metal layer M1 including the interconnection lines MIL may be formed in the third interlayer insulating layer 130. The first metal layer M1 may be electrically connected to the gate contacts GC and the first and second active contacts AC1 and AC2.

Figure 14:
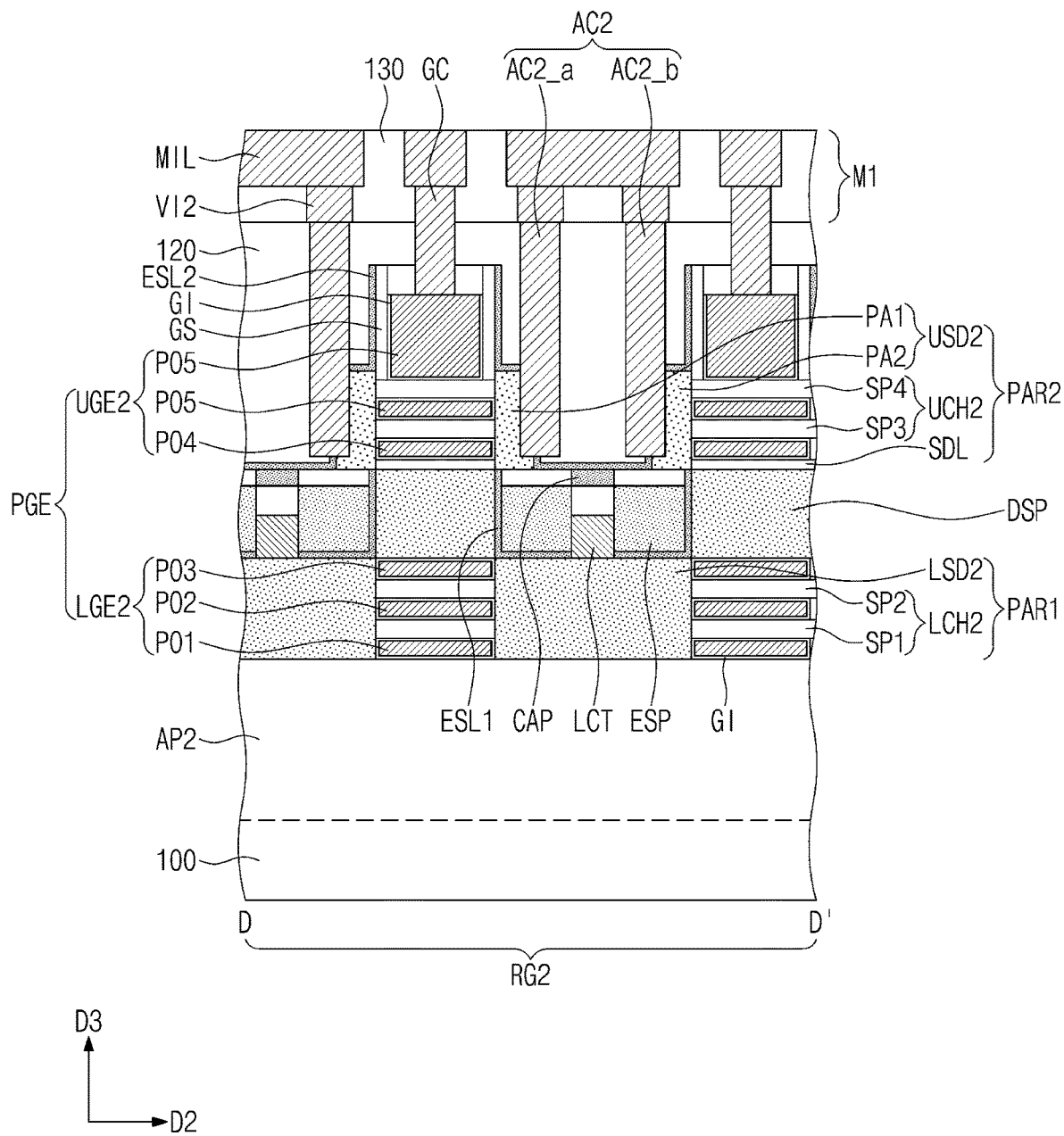
FIGS. 14 to 16 are sectional views, each of which is taken along the line D-D' of FIG. 3 to illustrate a three-dimensional semiconductor device according to an example embodiment.
Figure 15:
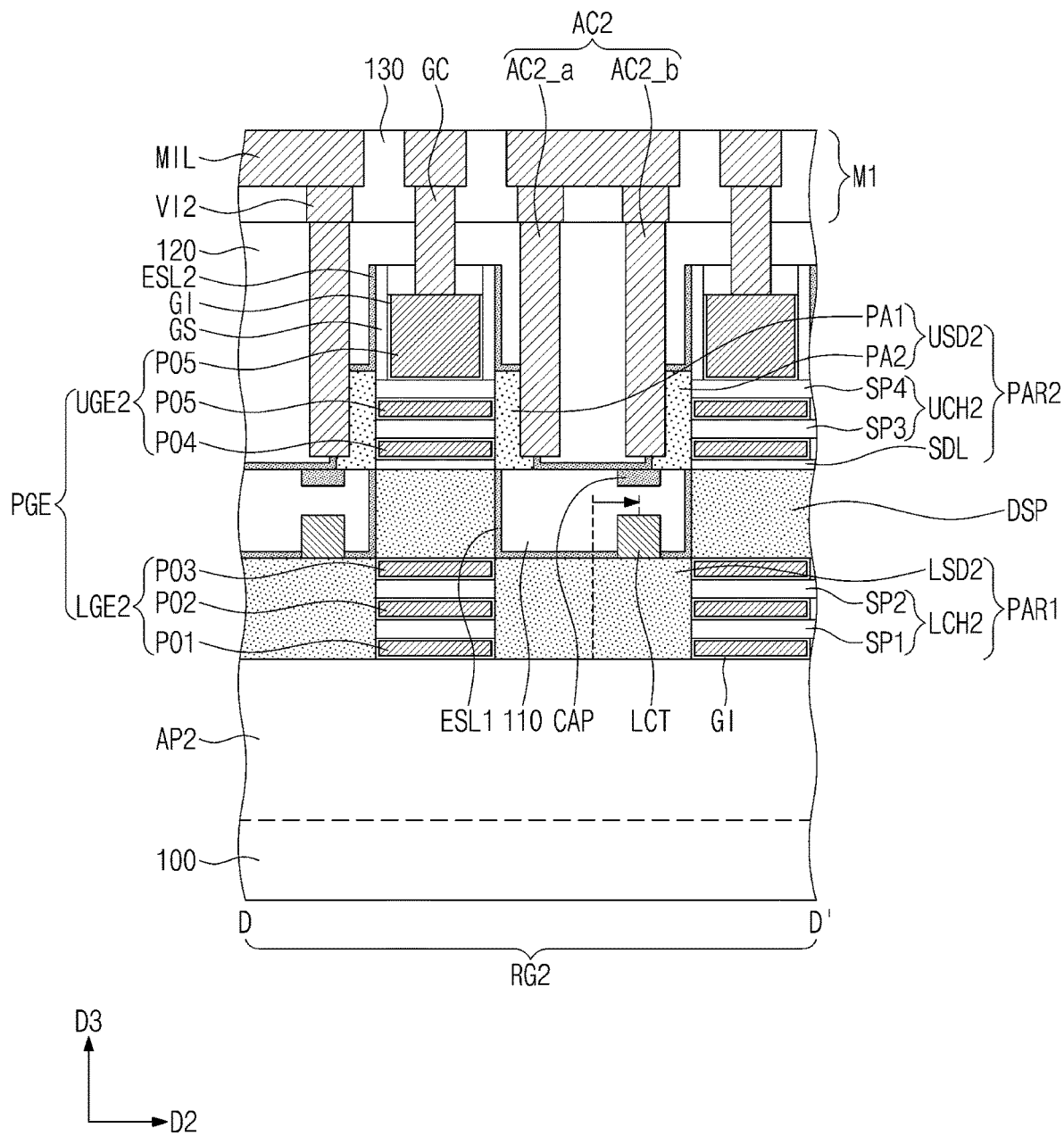
Figure 16:
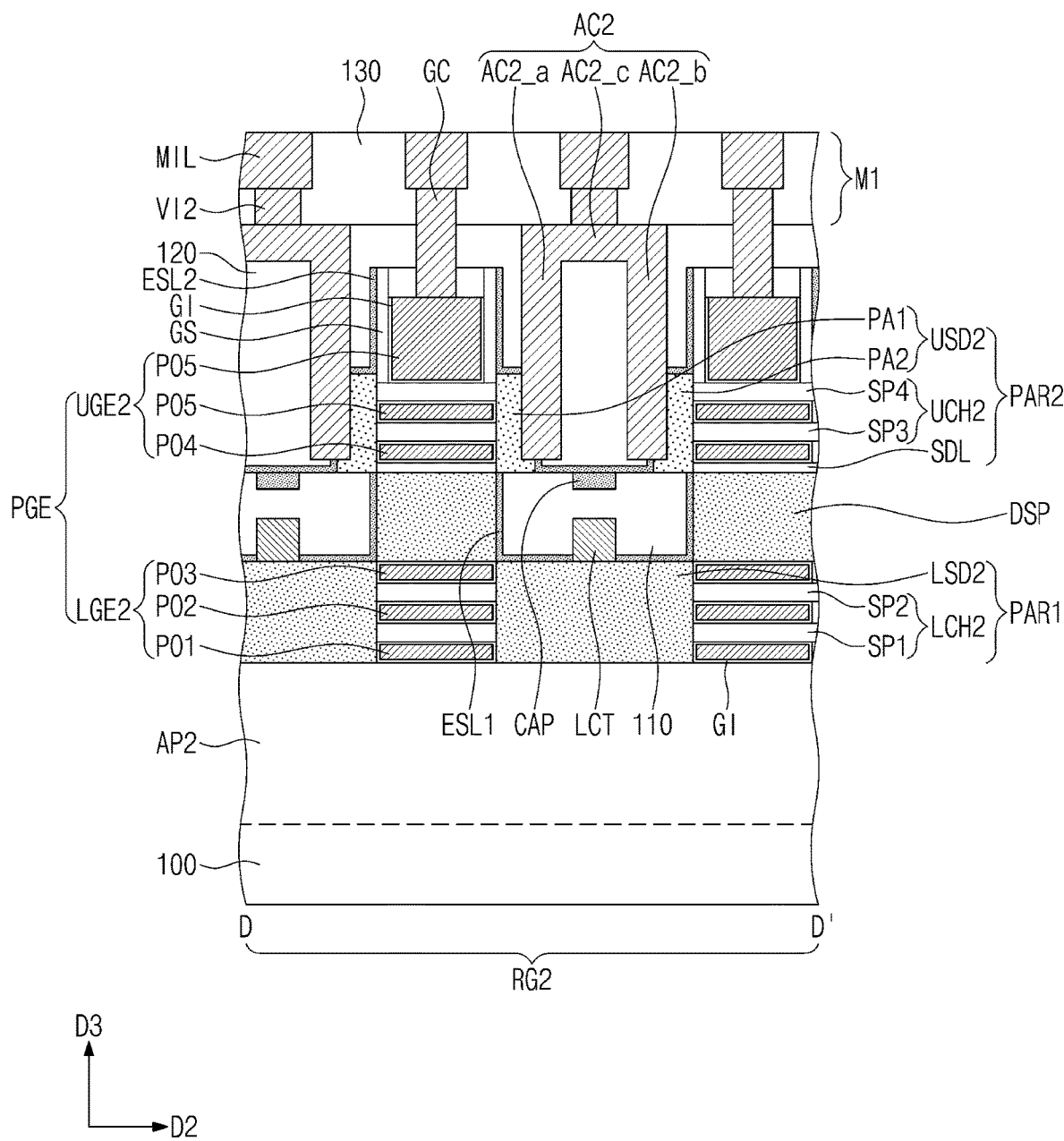

FIGS. 14 to 16 are sectional views, each of which is taken along the line D-D' of FIG. 3 to illustrate a three-dimensional semiconductor device according to an example embodiment. In the following description, an element previously described with reference to FIGS. 3 and 4A to 4E may be identified by the same reference number without repeating an overlapping description thereof, for the sake of brevity.

Referring to FIG. 14, etch stop patterns ESP may be provided at both sides of the lower contact LCT of the second region RG2. The etch stop patterns ESP may be disposed to be vertically overlapped with the first and second contacts AC2_a and AC2_b, respectively.

The etch stop pattern ESP may prevent the contacts AC2_a and AC2_b from being extended to the lower contact LCT and the second lower source/drain pattern LSD2, when an over-etching method is used to form the contact AC2_a and AC2_b. Due to the etch stop pattern ESP, the semiconductor device may be fabricated to have improved reliability.

Referring to FIG. 15, the lower contact LCT on the second region RG2 may be formed at a position that is horizontally offset from a center of the second lower source/drain pattern LSD2. In this regard, there may be a misalignment between the lower contact LCT and the second lower source/drain pattern LSD2. The lower contact LCT may be formed by a misalignment between the contact hole CTH and the second lower source/drain pattern LSD2 in the process of forming the contact hole CTH previously described with reference to FIG. 9C.

Although the lower contact LCT is offset from the second lower source/drain pattern LSD2, the lower contact LCT may still be effectively coupled to the second lower source/drain pattern LSD2, because the width of the lower contact LCT is smaller than the width of the second lower source/drain pattern LSD2.

Referring to FIG. 16, the second active contact AC2 on the second region RG2 may include the first contact AC2_a, the second contact AC2_b, and a connecting portion AC2_c connecting them to each other. That is, the second active contact AC2 may be formed to have a bridge shape.

In the case where the second active contact AC2 of the second region RG2 further includes the connecting portion AC2_c, any element in the first metal layer M1 may not be used to connect the first and second contacts AC2_a and AC2_b to each other. This may make it possible to increase a degree of freedom in designing and constructing the interconnection lines MIL in the first metal layer M1.

As described above, in a three-dimensional semiconductor device according to an example embodiment, the lower contact between the peripheral gate electrodes may be formed to have a width that is much smaller than a width of the lower source/drain pattern. Accordingly, a parasitic capacitance caused by the lower contact may be reduced, and this may make it possible to improve electrical characteristics of the semiconductor device.

In the three-dimensional semiconductor device, the first contact and the second contact may be provided to be in contact with the upper source/drain patterns, which are composed of the first and second sub-patterns. A contact resistance between the contact and the sub-pattern may be lowered by maximizing a contact area between the contact and the sub-pattern. As a result, the electrical characteristics of the semiconductor device may be improved.

While aspects of example embodiments have been particularly shown and described, it will be understood that various changes in form and details may be made therein without departing from the spirit and scope of the following claims.

What is claimed is:

1. A three-dimensional semiconductor device, comprising:
    a first active region on a substrate, the first active region comprising a lower channel pattern and a lower source/drain pattern connected to the lower channel pattern;
    a second active region on the first active region, the second active region comprising an upper channel pattern and an upper source/drain pattern connected to the upper channel pattern;
    a gate electrode on the lower channel pattern and the upper channel pattern;
    a lower contact electrically connected to the lower source/drain pattern, the lower contact having a bar shape extending on the lower source/drain pattern in a first direction;
    a first active contact coupled to the lower contact; and
    a second active contact coupled to the upper source/drain pattern,
    wherein a first width of the lower source/drain pattern in a second direction is larger than a second width of the lower contact in the second direction.

2. The three-dimensional semiconductor device of claim 1, wherein a ratio of the second width to the first width ranges from 0.1 to 0.5.

3. The three-dimensional semiconductor device of claim 1, wherein the lower contact is offset from a center of the lower source/drain pattern in the second direction.

4. The three-dimensional semiconductor device of claim 1, wherein each of the lower channel pattern and the upper channel pattern comprises a plurality of semiconductor patterns, which are vertically spaced apart from each other, and
    wherein the gate electrode encloses each of the plurality of semiconductor patterns.

5. The three-dimensional semiconductor device of claim 1, further comprising a dummy channel pattern interposed between the lower channel pattern and the upper channel pattern,
    wherein the dummy channel pattern is spaced apart from the lower source/drain pattern and the upper source/drain pattern.

6. The three-dimensional semiconductor device of claim 1, wherein the upper source/drain pattern comprises a first sub-pattern and a second sub-pattern spaced apart from the first sub-pattern in the second direction, and
    wherein the second active contact comprises a first contact and a second contact, which are respectively coupled to the first sub-pattern and the second sub-pattern.

7. The three-dimensional semiconductor device of claim 6, wherein the second active contact further comprises a connecting portion connecting the first contact to the second contact.

8. The three-dimensional semiconductor device of claim 6, wherein the lower contact is vertically offset from each of the first sub-pattern and the second sub-pattern.

9. The three-dimensional semiconductor device of claim 1, further comprising interconnection lines on, and electrically connected to, the first active contact and the second active contact.

10. The three-dimensional semiconductor device of claim 1, wherein the first active region and the second active region are provided in an extra gate (EG) device region.

11. A three-dimensional semiconductor device, comprising:
a first active region on a substrate, the first active region comprising a pair of lower channel patterns and a lower source/drain pattern between the pair of lower channel patterns;
a second active region on the first active region, the second active region comprising a pair of upper channel patterns and an upper source/drain pattern between the pair of upper channel patterns;
gate electrodes provided on the pair of lower channel patterns and the pair of upper channel patterns;
a lower contact electrically connected to the lower source/drain pattern;
a first active contact coupled to the lower contact; and
a second active contact coupled to the upper source/drain pattern,
wherein the upper source/drain pattern comprises a first sub-pattern connected to one of the pair of upper channel patterns, and a second sub-pattern connected to another one of the pair of upper channel patterns,
wherein the first sub-pattern is separated from the second sub-pattern, and
wherein the second active contact comprises a first contact and a second contact, which are respectively coupled to the first sub-pattern and the second sub-pattern.

12. The three-dimensional semiconductor device of claim 11, wherein the second active contact further comprises a connecting portion connecting the first contact to the second contact.

13. The three-dimensional semiconductor device of claim 11, further comprising an interconnection line on the second active contact,
wherein the interconnection line is provided to electrically connect the first contact to the second contact.

14. The three-dimensional semiconductor device of claim 11, wherein the lower contact has a bar shape extending from the lower source/drain pattern in a first direction, and
wherein the first sub-pattern is spaced apart from the second sub-pattern in a second direction crossing the first direction.

15. The three-dimensional semiconductor device of claim 11, wherein the first contact is extended from a top surface of the first sub-pattern along a side surface of the first sub-pattern, and
wherein the second contact is extended from a top surface of the second sub-pattern along a side surface of the second sub-pattern.

16. A three-dimensional semiconductor device, comprising:
a first active region on a first region of a substrate, the first active region comprising a first lower channel pattern and a first lower source/drain pattern connected to the first lower channel pattern;
a second active region on the first active region, the second active region comprising a first upper channel pattern and a first upper source/drain pattern connected to the first upper channel pattern;
a gate electrode on the first lower channel pattern and the first upper channel pattern;
a first peripheral active region on a second region of the substrate, the first peripheral active region comprising a second lower channel pattern and a second lower source/drain pattern connected to the second lower channel pattern;
a second peripheral active region on the first peripheral active region, the second peripheral active region comprising a second upper channel pattern and a second upper source/drain pattern connected to the second upper channel pattern;
a peripheral gate electrode on the second lower channel pattern and the second upper channel pattern;
a first active contact coupled to the first upper source/drain pattern; and
a second active contact coupled to the second upper source/drain pattern,
wherein the first upper channel pattern comprises a pair of first upper channel patterns, which are adjacent to each other,
wherein the first upper source/drain pattern is provided as a continuous body connecting the pair of first upper channel patterns to each other,
wherein the second upper channel pattern comprises a pair of second upper channel patterns, which are adjacent to each other,
wherein the second upper source/drain pattern comprises a first sub-pattern connected to one of the pair of second upper channel patterns, and a second sub-pattern connected to another one of the pair of second upper channel patterns, and
wherein the first sub-pattern is separated from the second sub-pattern.

17. The three-dimensional semiconductor device of claim 16, wherein the second active contact comprises a first contact and a second contact, which are respectively coupled to the first sub-pattern and the second sub-pattern.

18. The three-dimensional semiconductor device of claim 17, wherein the second active contact further comprises a connecting portion connecting the first contact to the second contact.

19. The three-dimensional semiconductor device of claim 16, wherein the first region comprises a single gate (SG) device, and
wherein the second region comprises an extra gate (EG) device.

20. The three-dimensional semiconductor device of claim 16, further comprising:
a first lower contact electrically connected to the first lower source/drain pattern; and
a second lower contact electrically connected to the second lower source/drain pattern,
wherein a ratio of a width of the first lower contact to a width of the first lower source/drain pattern is greater than a ratio of a width of the second lower contact to a width of the second lower source/drain pattern.

* * * * *